United States Patent
Saihara

(10) Patent No.: US 10,587,133 B2
(45) Date of Patent: Mar. 10, 2020

(54) CRADLE MOUNTING SYSTEM FOR ELECTRONIC DEVICE AND DETACHABLE BATTERY

(71) Applicant: SATO HOLDINGS KABUSHIKI KAISHA, Tokyo (JP)

(72) Inventor: Miwako Saihara, Tokyo (JP)

(73) Assignee: SATO HOLDINGS KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/331,375

(22) PCT Filed: Aug. 28, 2017

(86) PCT No.: PCT/JP2017/030685
§ 371 (c)(1),
(2) Date: Mar. 7, 2019

(87) PCT Pub. No.: WO2018/051768
PCT Pub. Date: Mar. 22, 2018

(65) Prior Publication Data
US 2019/0199111 A1    Jun. 27, 2019

(30) Foreign Application Priority Data

Sep. 13, 2016 (JP) ................. 2016-178361
Sep. 13, 2016 (JP) ................. 2016-178362
Sep. 13, 2016 (JP) ................. 2016-178363

(51) Int. Cl.
*H02J 7/00* (2006.01)
*H01M 2/10* (2006.01)
(Continued)

(52) U.S. Cl.
CPC ......... *H02J 7/0044* (2013.01); *H01M 2/1066* (2013.01); *H01M 10/46* (2013.01);
(Continued)

(58) Field of Classification Search
CPC ...................................... H02J 7/0044
(Continued)

(56) References Cited

U.S. PATENT DOCUMENTS 5,341,171 A * 8/1994 Mori ............... G11B 31/006
                                                    348/373
2006/0125444 A1* 6/2006 Lam ............... H01M 2/1022
                                                    320/107

(Continued)

FOREIGN PATENT DOCUMENTS

EP     0 701 357 A2    3/1996
JP     07-273849 A    10/1995
(Continued)

OTHER PUBLICATIONS

Extended European Search Report, Application No. 17850672.1, dated Aug. 19, 2019, 11 pages.

*Primary Examiner* — Jerry D Robbins
(74) *Attorney, Agent, or Firm* — Foley & Lardner LLP

(57) ABSTRACT

A mounting system according to one embodiment includes: a battery container having a charging terminal and configured to store a secondary battery; an electronic device having a power-supply terminal and configured to attach the battery container detachably; a mounting device having an external power-supply terminal to supply external power and configured to mount the battery container or the electronic device; and a joint mechanism configured to join the electronic device and the mounting device when the battery container is not attached to the electronic device. The joint mechanism does not join the electronic device and the mounting device when the battery container is attached to the electronic device.

26 Claims, 24 Drawing Sheets

(51) Int. Cl.
*H05K 5/00* (2006.01)
*H01M 10/46* (2006.01)
*H05K 5/02* (2006.01)

(52) U.S. Cl.
CPC ......... *H05K 5/0017* (2013.01); *H05K 5/0021* (2013.01); *H05K 5/0226* (2013.01); *H01M 2220/30* (2013.01)

(58) Field of Classification Search
USPC ........................................................ 320/107
See application file for complete search history.

(56) References Cited

U.S. PATENT DOCUMENTS

2007/0165996 A1* 7/2007 Inaba .................. G11B 31/006
386/224
2016/0042337 A1* 2/2016 Ota ...................... G06Q 20/202
705/21

FOREIGN PATENT DOCUMENTS

| JP | 2006-280186 A | 10/2006 |
|----|---------------|---------|
| JP | 3916182 B2    | 5/2007  |
| JP | 2009-262773 A | 11/2009 |
| JP | 2011-155608 A | 8/2011  |
| JP | 2015-028758 A | 2/2015  |
| JP | 2015-163036 A | 9/2015  |
| JP | 2016-048537 A | 4/2016  |
| JP | 2016-064549 A | 4/2016  |

* cited by examiner

FIG. 3
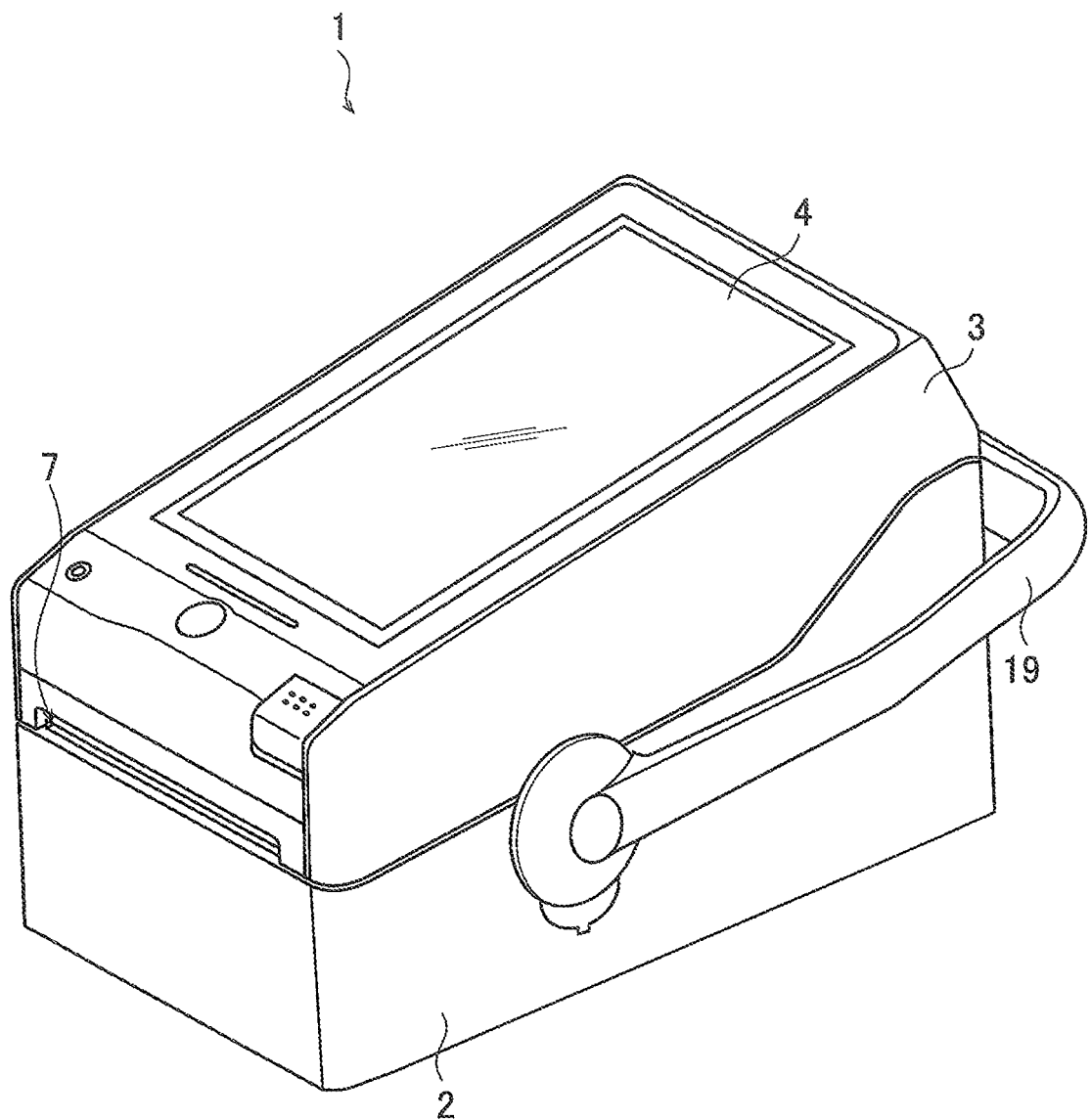
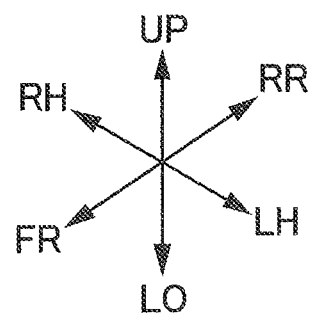

A-A 30 (B-B CROSS SECTION)

30 (B-B CROSS SECTION)

CRADLE MOUNTING SYSTEM FOR ELECTRONIC DEVICE AND DETACHABLE BATTERY

TECHNICAL FIELD

The present invention relates to mounting systems to mount an electronic device, such as a printer.

BACKGROUND

Conventionally mounting systems have been known, and a mounting system includes a battery unit capable of storing a secondary battery, an electronic device, to which such a battery unit can be attached detachably, and a mounting device to mount the battery unit and/or the electronic device. Examples of the electronic device include a printer, a video camera, and a personal computer. The mounting device may be called a cradle.

Patent Literature 1, for example, describes a mobile printer including a secondary battery built therein and a cradle to mount the mobile printer, and the secondary battery can be charged when the mobile printer is mounted on the cradle.

Such a mounting device to mount an electronic device and the like often has a terminal that is exposed to be in contact with a terminal of the electronic device to be mounted. A known mounting device therefore is configured to prevent the short circuit between the terminals due to water entry. Patent Literature 2, for example, describes a charger having a positive terminal and a negative terminal covered with a side wall. The battery charger is configured to limit contact of these terminals with water by providing a partition wall to divide a space surrounded with the side wall.

Conventionally a printer having a body to which a battery can be attached has been known. Patent Literature 3, for example, describes such a printer. This printer includes a printer body and a locking device to lock the body with a battery case for connection. The printer body has a container, for example, defined at the bottom face to store the battery case. Patent Literature 4 describes a small printer having a battery container.

CITATION LIST

Patent Literature

Patent Literature 1: JP 2016-48537 A
Patent Literature 2: JP 2015-163036 A
Patent Literature 3: JP 3916182 B
Patent Literature 4: JP 2016-64549 A

SUMMARY OF THE INVENTION

Technical Problem

It is convenient for a user to mount an electronic device on a cradle of a conventional mounting system while changing the joint state of the electronic device with the cradle depending on the user's purpose.

For example, when a user uses the electronic device mainly with a battery, the user typically mounts the electronic device having the battery unit attached on the cradle and then charges the battery in the battery unit. When using the electronic device, the user typically disconnects the electronic device from the cradle while leaving the battery unit attached to the electronic device. Therefore, it is preferable not to joint (lock) the electronic device with the cradle when the user mounts the electronic device having the battery unit attached on the cradle.

Meanwhile, when a user uses the electronic device mainly with commercial power, the user may use the electronic device that is disconnected from the battery unit because the battery unit is heavy. When such an electronic device without the battery unit is mounted on the cradle, an AC adaptor built in the cradle has to be protected. To this end, it is preferable to carry the electronic device for use while leaving the electronic device mounted on the cradle. In that case, it is preferable to joint (lock) the electronic device with the cradle.

The partition wall described in Patent Literature 2 is effective to prevent water entry. However, once water enters into the inside of the side wall, it is difficult to prevent short-circuit of the terminals reliably. In this way, the conventional mounting devices cannot prevent the short-circuit of terminals due to liquid, such as water, reliably.

The printer described in Patent Literature 3 is configured so that the battery case occupies about half of the bottom face of the body (see FIG. 2 of Patent Literature 3). This means that the space of the container of the printer body is wasted when the battery is not used, and the printer body cannot stand stably.

The printer described in Patent Literature 4 has a large space for the battery container relative to the entire space, and so when the battery is not used, such a space is wasted. In other words, the battery storing space of the printer is a factor to inhibit making the printer compact.

Then the present invention aims to provide a mounting system that can change the joint state of an electronic device with a mounting device.

The present invention aims to provide a mounting device that can prevent short-circuit of terminals due to liquid, such as water, sufficiently.

The present invention aims to provide a printer having a body to which a battery can be attached, the printer having a smaller body and capable of standing stably when the battery is not used.

Solution to Problem

An embodiment of the present invention is a mounting system, including: a battery container having a charging terminal and configured to store a secondary battery; an electronic device having a power-supply terminal and configured to attach the battery container thereto detachably; a mounting device having an external power-supply terminal to supply external power and configured to mount the battery container or the electronic device thereon; and a joint mechanism configured to join the electronic device and the mounting device when the battery container is not attached to the electronic device, wherein the joint mechanism does not join the electronic device and the mounting device when the battery container is attached to the electronic device.

Another embodiment of the present invention is a mounting device for mounting a device to be mounted, the mounting device including: a first terminal group that electrically connects with a device to be mounted that is the electronic device or the battery container, the first terminal group including terminals to which a same first voltage is applied; a second terminal group that is different from the first terminal group and electrically connects with the device to be mounted, the second terminal group including terminals to which a same second voltage is applied; and a plurality of bumps that stand from a referential face, the referential face being opposed to the device to be mounted when the device to be mounted is mounted on the mounting device, wherein the first terminal group and the second terminal group are disposed at a different bump of the plurality of bumps from each other.

Yet another embodiment of the present invention is printer including: a printer body; and a battery container attached to the printer body detachably, wherein the battery container is located so that the upper face of the battery container covers the entire bottom face of the printer body in the plan view.

Advantageous Effects

According to one aspect of the present invention, the mounting system can change the joint state of an electronic device with a mounting device.

According to another aspect of the present invention, the mounting device can prevent the short-circuit of terminals due to liquid, such as water, sufficiently.

According to another aspect of the present invention, a printer having a body to which a battery can be attached, and the printer has a smaller body and is capable of standing stably when the battery is not used.

BRIEF DESCRIPTION OF THE DRAWINGS

FIG. 3 is a perspective view of a printer according to one embodiment when the cover is closed.

DESCRIPTION OF EMBODIMENTS (1) Mounting System 50

Figure 1:
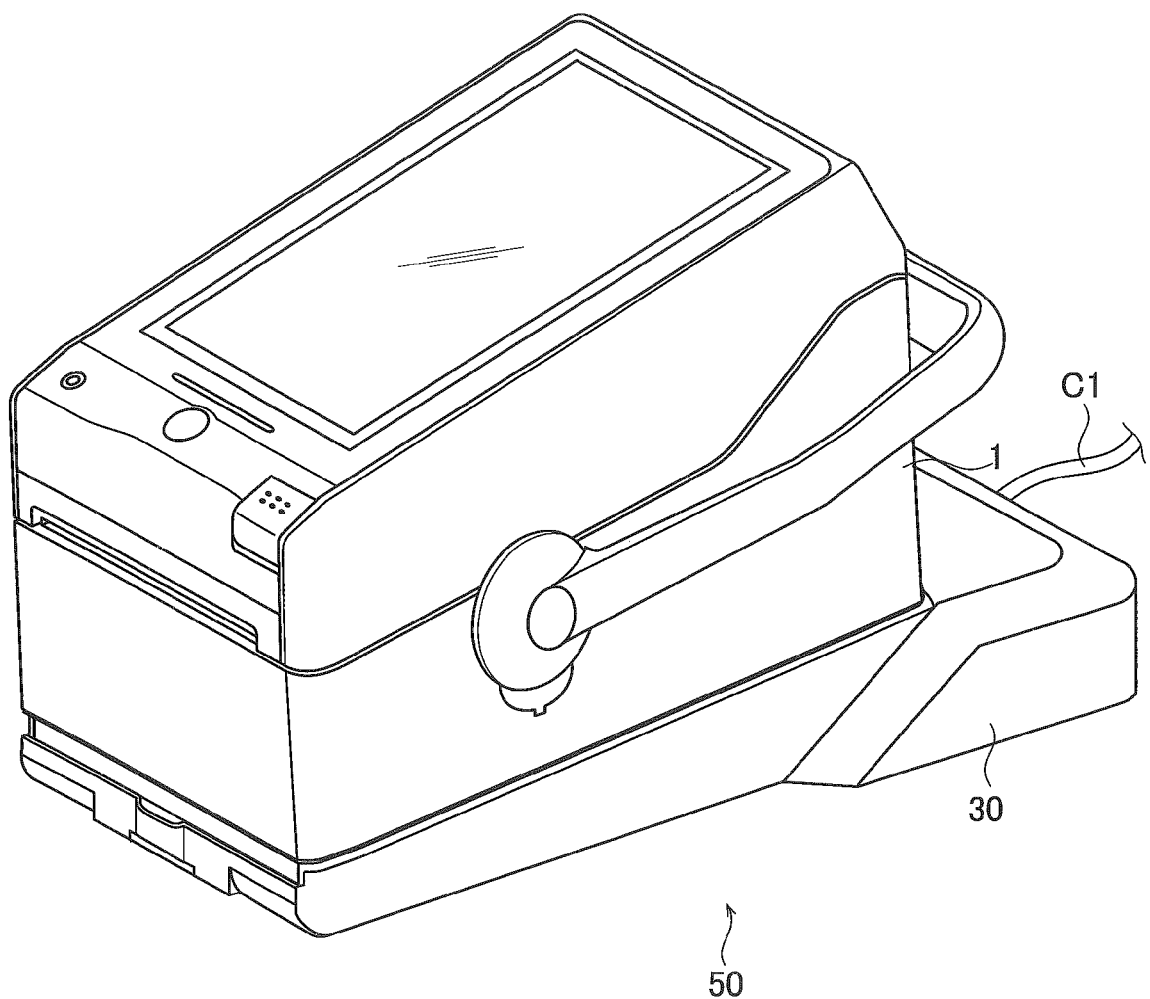
FIG. 1 is a perspective view of a mounting system according to one embodiment when a printer is mounted on a cradle.
Figure 2:
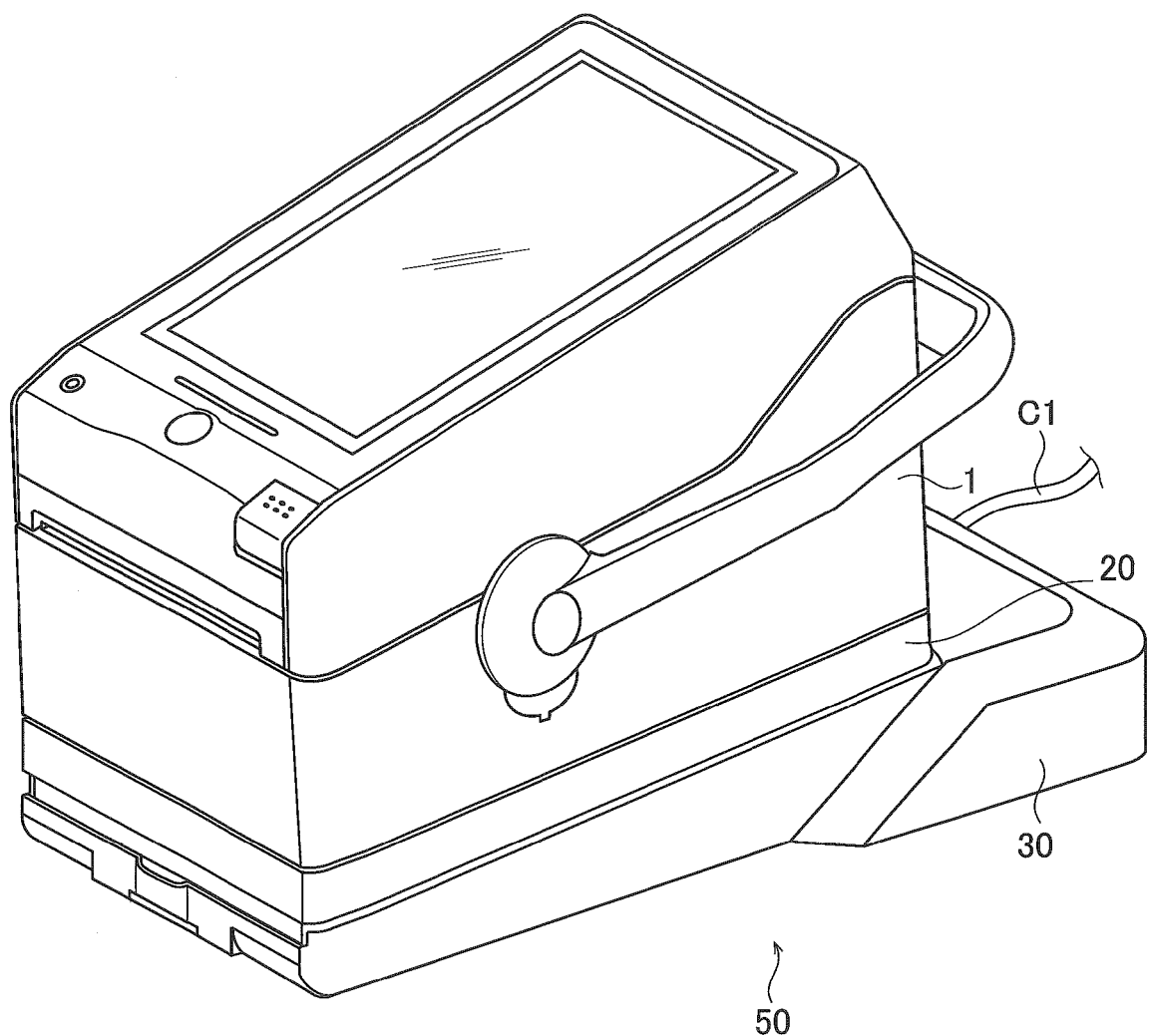
FIG. 2 is a perspective view of a mounting system according to one embodiment when a battery unit is mounted on a cradle.

Referring to FIGS. 1 and 2, the following describes one embodiment of a mounting system 50 according to the present invention. FIG. 1 is a perspective view of the mounting system according to the present embodiment when the printer is mounted on the cradle. FIG. 2 is a perspective view of the mounting system according to the present embodiment when the battery unit is mounted on the cradle.

As shown in FIGS. 1 and 2, the mounting system 50 of the present embodiment includes a printer 1, a battery unit 20 and a cradle 30 that is a mounting device. The printer 1 is one example of the electronic device to be mounted on the cradle 30. The battery unit 20 can be attached to the printer 1 detachably, and can store a secondary battery, such as a lithium ion battery. As described later, the cradle 30 includes an AC adaptor built therein. The AC adaptor can be connected to an external commercial power via cable C1.

When the battery unit 20 is not attached to the printer 1, the printer in this state can be called a printer body.

The mounting system 50 of the present embodiment can be used in two modes. In one mode, the user mounts the printer 1 without the battery unit 20 attached on the cradle 30. In the other mode, the user mounts the printer 1 with the battery unit 20 attached on the cradle 30.

As shown in FIG. 1, in the former mode, the user does not attach the battery unit 20 to the printer 1 and then mounts the printer 1 so that the bottom face is opposed to the cradle 30 for use (hereinafter this may be called "usage mode U1" as needed). As shown in FIG. 2, in the latter mode, the user attaches the battery unit 20 to the printer 1 and then mounts the printer so that the bottom face of the battery unit 20 is opposed to the cradle 30 for use (hereinafter this may be called "usage mode U2" as needed).

In the usage mode U1, the printer 1 operates with DC voltage obtained from the AC adaptor built in the cradle 30. In this case, the printer 1 joins (is locked) with the cradle 30. The usage mode U1 is useful for carrying the printer 1 and the cradle 30 as one unit to use the printer 1, because the heavy battery unit 20 is not attached to the printer 1, and the printer 1 and the cradle 30 join. As described later, the cradle 30 includes the AC adaptor built therein, and the AC adaptor can be protected during the use of the printer 1.

The usage mode U2 mainly is to charge the battery stored in the battery unit 20. When mounting the bottom face of the battery unit 20 on the cradle 30, the battery unit 20 and the cradle 30 do not join (are not locked). Therefore the user does not have to cancel the joining of the battery unit 20 with the cradle 30, and so the operation is not troublesome for the user when they mount the printer 1 and the battery unit 20 as one unit on the cradle 30 or detach them from the cradle 30. This usage mode therefore is favorable for the operability when the print 1 operates mainly with a battery.

Note here that when the battery unit 20 is not attached to the printer 1, the battery unit 20 alone is mounted on the cradle 30, and then the AC adaptor built in the cradle 30 is connected to a commercial power, the battery in the battery unit 20 cannot be charged.

(2) Printer 1

The following describes the printer 1 according to the present embodiment.

Figure 4:
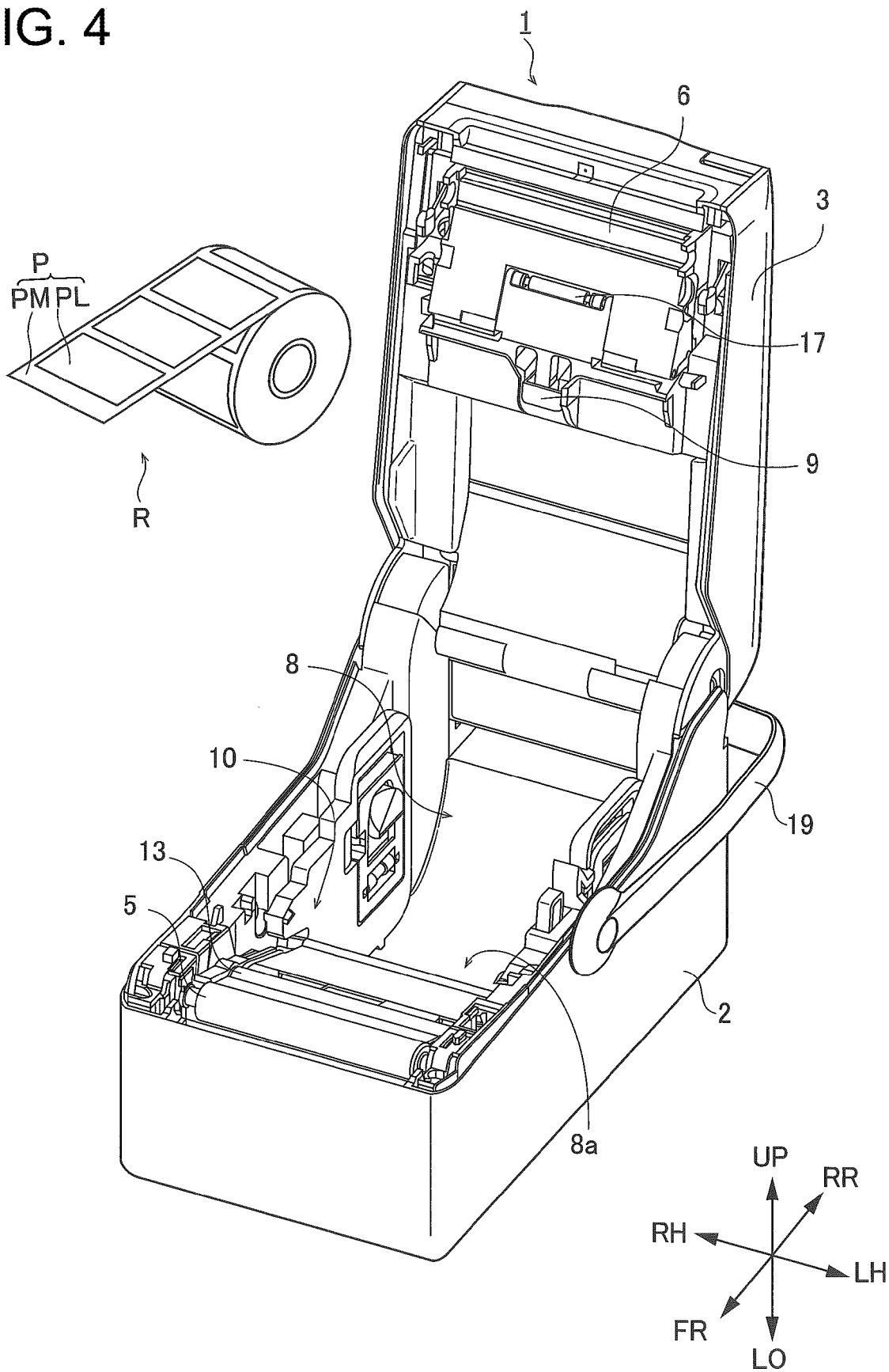
FIG. 4 is a perspective view of a printer according to one embodiment when the cover is open.
Figure 5:
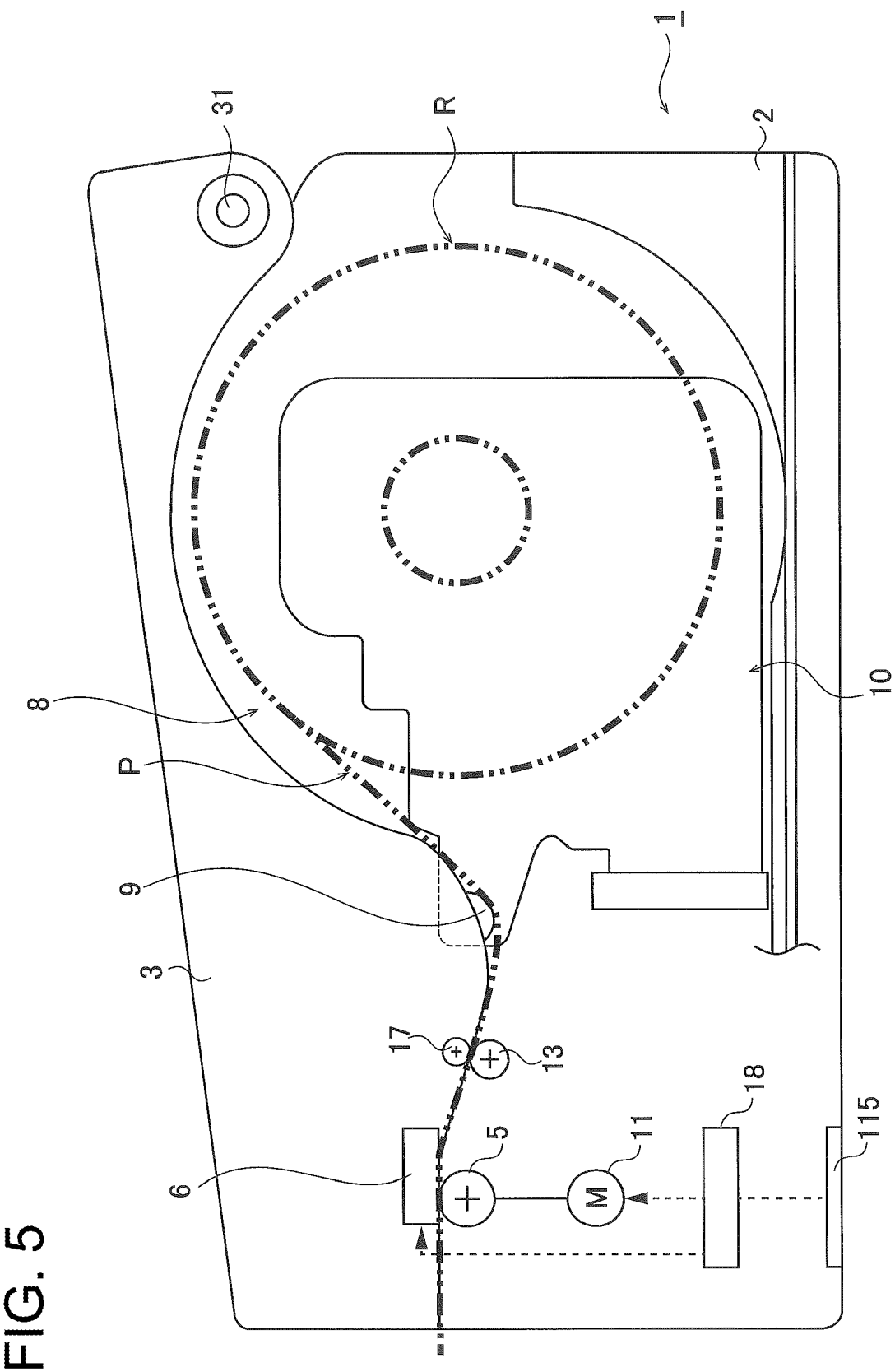
FIG. 5 is a schematic cross-sectional view of a printer according to one embodiment to explain the operation of the printer.

Referring firstly to FIGS. 3 to 5, the following describes the overall structure and the operation of the printer 1.

FIG. 3 is a perspective view of the printer 1 according to the present embodiment when a cover 3 is closed. FIG. 4 is a perspective view of the printer 1 according to the present embodiment when the cover 3 is open. FIG. 5 is a schematic cross-sectional view of the printer 1 according to the present embodiment to explain the operation of the printer 1. In FIG. 5, broken lines show electric connections inside of the printer 1.

As shown in FIGS. 3 to 5, the printer 1 of the present embodiment includes a housing 2, the cover 3, a display panel 4, a platen roller 5, a thermal head 6, a container 8, a damper 9, a guide mechanism 10, a motor 11, assisting rollers 13, 17, a controller 18 and a handle 19. The housing 2 is shaped to match with the outer shape of the printer 1.

As described in FIG. 3, the printer 1 has a substantially rectangular bottom face, and the direction along the long side of the bottom face is defined as the front-rear direction. Specifically, a side of the printer having the platen roller 5 placed downstream in the feeding direction is defined as the front (FR), and a side of the printer on the opposite side and upstream in the feeding direction is defined as the rear (RR). Then the right (RH), the left (LH), the upper (UP) and the lower (LO) are defined relative to the front-rear direction. In the following description, the right (RH) or the left (LH) direction may be called a transverse direction and the upper (UP) or the lower (LO) direction may be called a vertical direction as needed.

The container 8 is an internal space of the housing 2 to store a roll of paper R. The space is defined with the inner bottom face of the housing at the bottom, the inner face of the cover 3 at the top, and the inner side faces of the housing on the left and right. The cover 3 is to open or close the container 8. The cover 3 is supported swingably relative to the housing 2 at their rear ends via a shaft 31 (see FIG. 5).

As shown in FIG. 4, a roll of paper R is a roll into which a belt-like continuous sheet P is wound. In the illustrated example, the continuous sheet P includes a belt-like liner PM and a plurality of labels PL. These labels are temporally attached on the liner at predetermined intervals.

The printer 1 of the present embodiment extracts a continuous sheet P from the roll of paper R while rotating the platen roller 5, and the container 8 includes a space to define the feed path of the extracted continuous sheet P from the roll of paper to the platen roller 5.

The guide mechanism 10 for a roll of paper R is provided on the inner bottom face 8a of the container 8. The guide mechanism 10 will be described later. The guide mechanism 10 holds the roll of paper R rotatably in the container 8 and limits the movement of the roll of paper R in the width direction. The guide mechanism 10 of the present embodiment may incorporate a motion mechanism to adjust the position of the roll of paper R in the width direction so as to support a variety of rolls of paper R having different widths.

The damper 9 is opposed to the surface (specifically a print surface) of the continuous sheet P extracted from the roll of paper R. The damper absorbs fluctuations in tension of the continuous sheet P.

As shown in FIG. 3, the display panel 4 is located on the front surface of the cover 3. The display panel 4 provides an input/output interface to a user when the cover 3 is closed. The display panel is a liquid crystal panel having a touch-panel function, for example.

As shown in FIG. 4, the platen roller 5 is supported rotatably in the forward and reverse directions at a downstream part of the housing 2 in the feeding direction. The platen roller 5 is a feeding means to feed the continuous sheet P extracted from the roll of paper R. The platen roller extends in the width direction of the continuous sheet P. The platen roller 5 is driven by the motor 11 (see FIG. 5).

The assisting roller 13 is disposed on the side of the housing 2, and the assisting roller 17 is disposed on the side of the cover 3. As shown in FIG. 5, when the cover 3 is closed, the assisting rollers 13, 17 are opposed while sandwiching the continuous sheet P therebetween to assist the feeding of the continuous sheet P toward the platen roller 5.

The thermal head 6 is mounted at the cover 3 so as to be opposed to the platen roller 5 when the cover 3 is closed.

The thermal head 6 is a print means to print information, such as letters, symbols, graphics or barcodes, on a label PL of the continuous sheet P extracted from the roll of paper R. As shown in FIG. 5, when the cover 3 is closed, the print face of the thermal head 6 faces the feed path of the continuous sheet P and the thermal head 6 is opposed to the platen roller 5. On the print face of the thermal head 6, a plurality of heater resistors (heater elements) that generate heat when applying current are arranged along the width direction of the continuous sheet P. The thermal head 6 electrically connects to the controller 18.

Although not illustrated, a coil spring is located on the rear face of the thermal head 6. This coil spring gives a biasing force to the thermal head 6.

When the cover 3 is closed for printing, the continuous sheet P extracted from the roll of paper R is fed by the platen roller 5 while being sandwiched between the platen roller 5 and the thermal head 6. At this time, the thermal head 6 is pressed against the platen roller 5 by the biasing force, whereby pressure from the head suitable for printing can be generated.

As shown in FIG. 5, when the cover 3 is closed and the platen roller 5 is driven in the forward direction, the continuous sheet P extracted from the roll of paper R held by the guide mechanism 10 moves toward the platen roller 5 while being sandwiched between the assisting rollers 13, 17. The operation of the damper 9 between the assisting rollers 13, 17 and the container 8 absorbs fluctuations in tension of the continuous sheet P extracted from the roll of paper R. After printing on the continuous sheet P by the thermal head 6 opposed to the platen roller 5, the printer ejects the continuous sheet P to the outside of the printer 1 through an ejection port 7 that is a gap defined between the housing 2 and the cover 3 when the cover 3 is closed.

The controller 18 mainly is made up of a micro-controller. The controller controls the motor 11 based on print data and sends a print signal to the thermal head 6.

The controller 18 receives a predetermined external voltage that is an output from the battery or the AC adaptor via the connector 115. The external voltage is supplied to the controller when the user directly mounts the printer 1 on the cradle 30 and connects the AC adaptor built in the cradle 30 with a commercial power. Voltage is supplied to the controller from the battery when the user attaches the battery unit 20 to the printer 1.

When the user mounts the printer 1 with the battery unit 20 attached on the cradle 30 and connects the AC adaptor built in the cradle 30 with a commercial power, charging to the battery stored in the battery unit 20 starts. During the charging of the battery, the controller 18 controls the charging to the battery unit 20.

Figure 6:
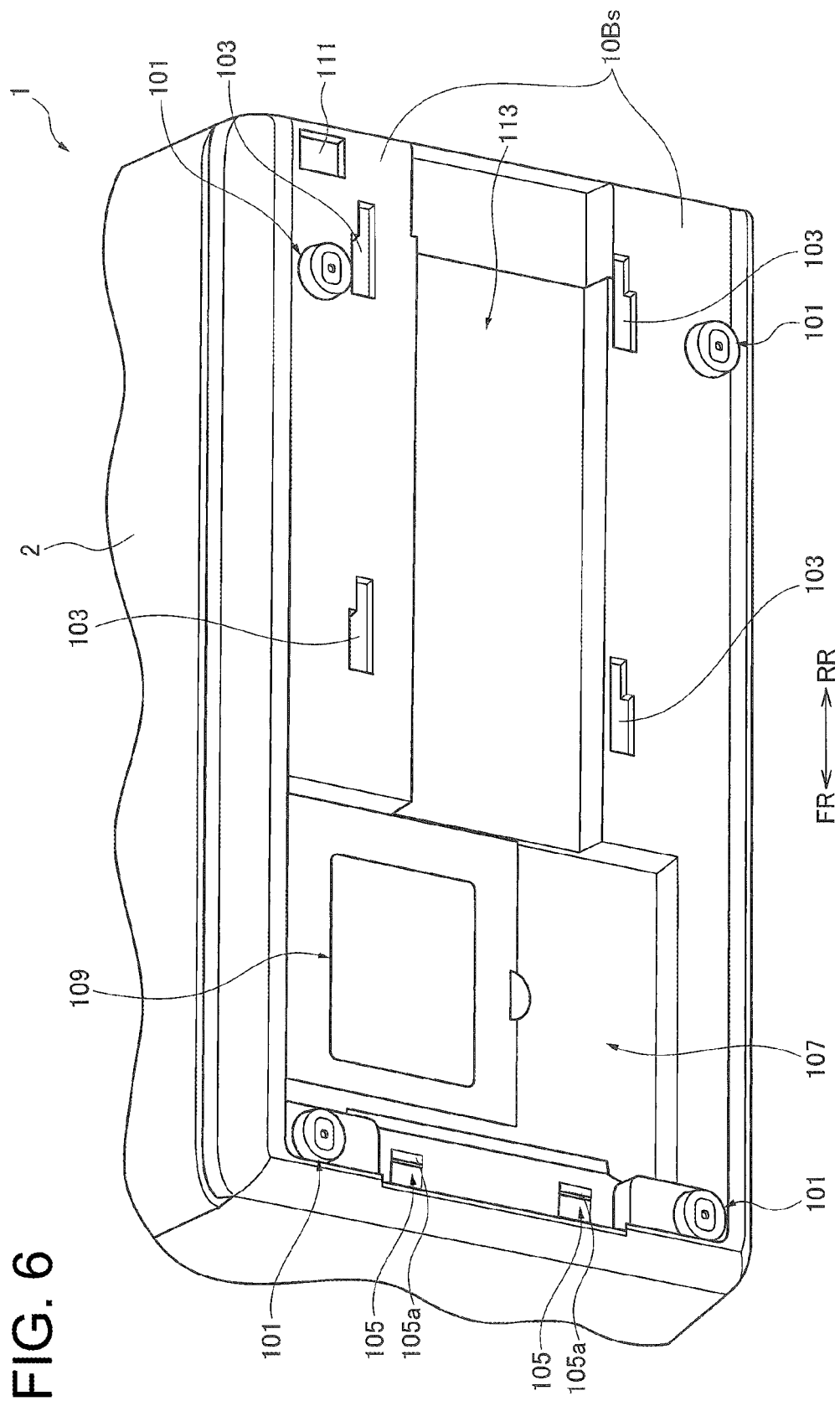
FIG. 6 is a perspective view of a printer according to one embodiment viewed from the bottom face.
Figure 7:
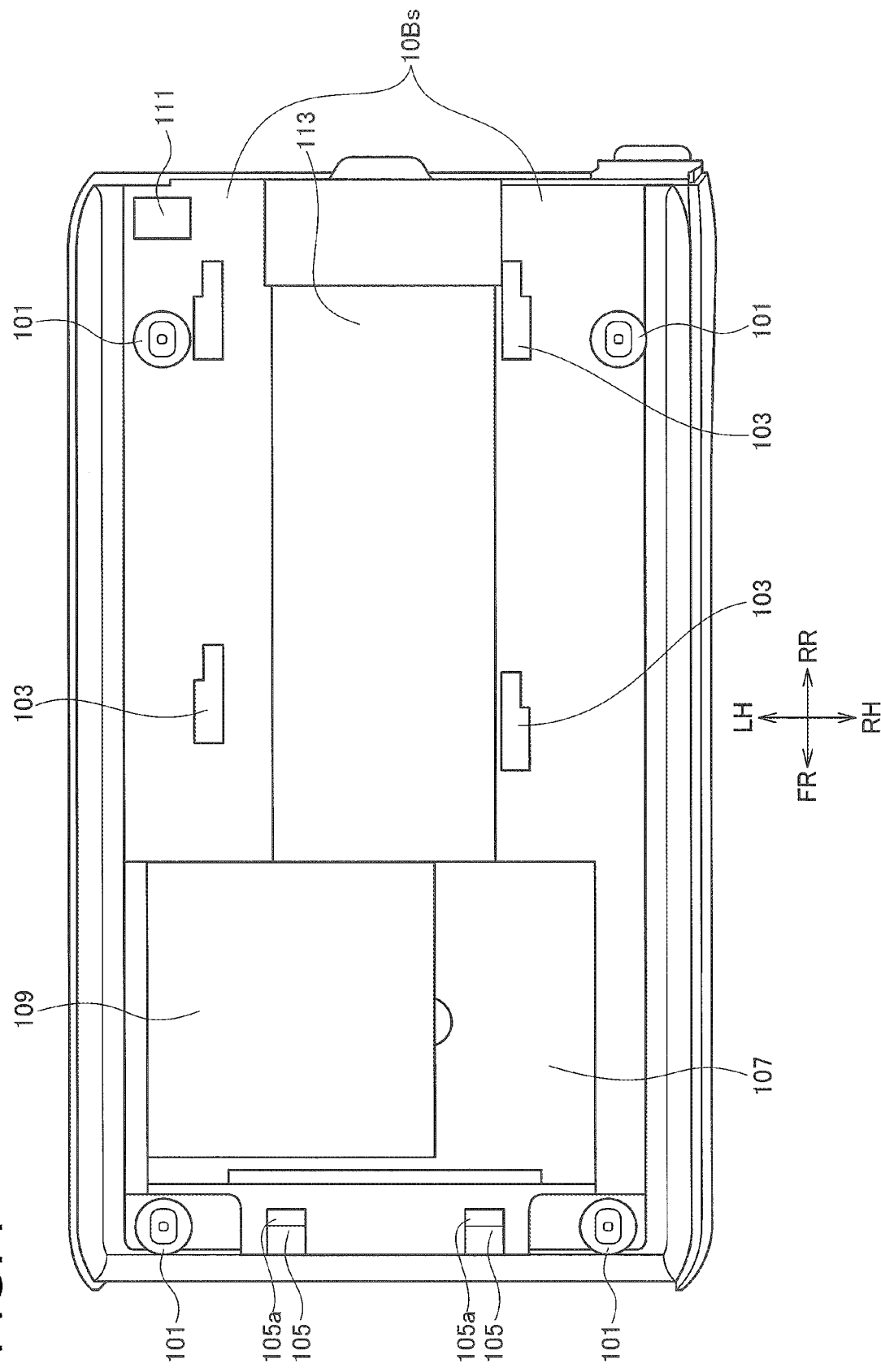
FIG. 7 is a bottom view of a printer according to one embodiment when the connector cover is closed.
Figure 8:
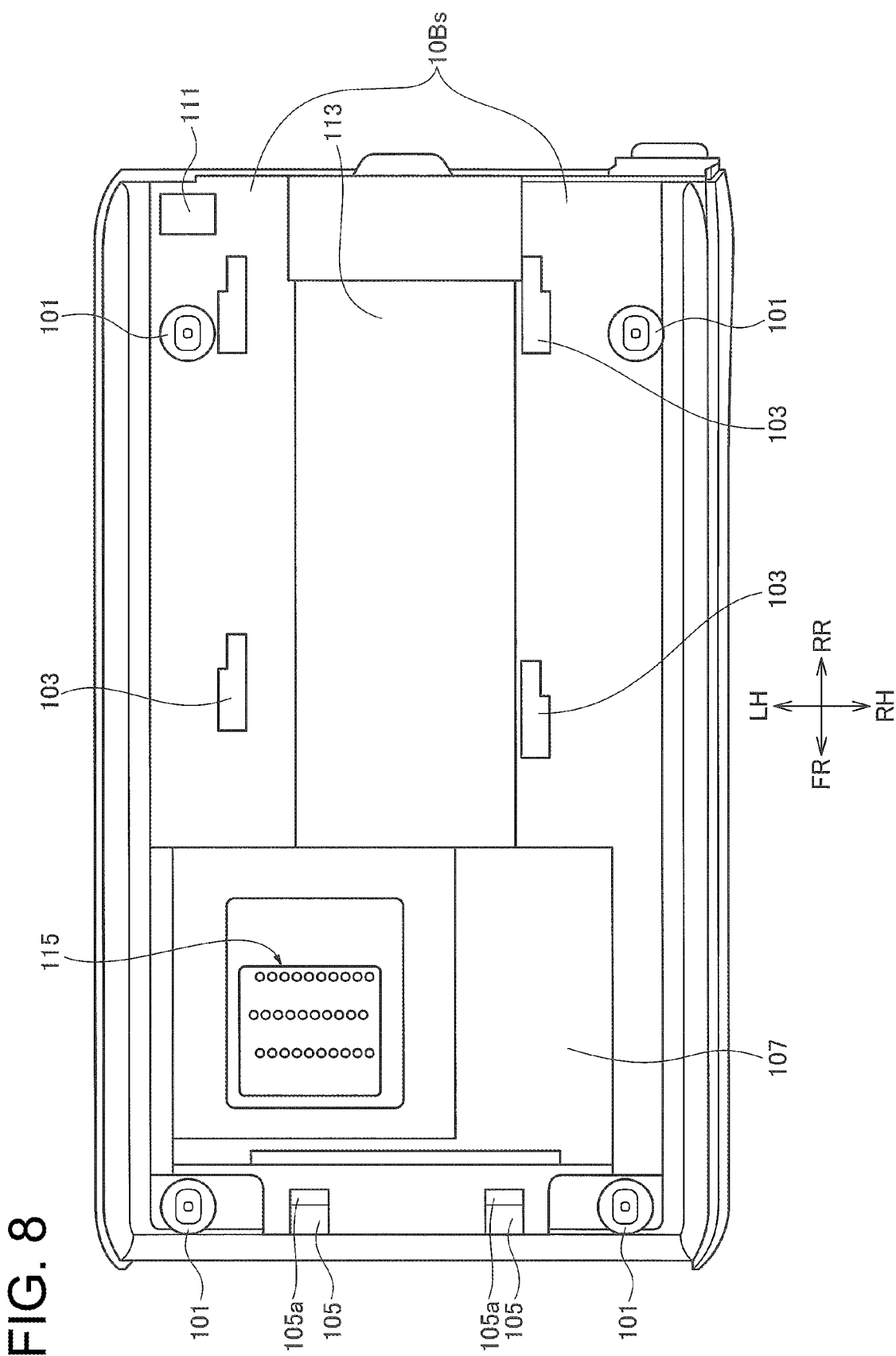
FIG. 8 is a bottom view of a printer according to one embodiment when the connector cover is open.

Referring next to FIGS. 6 to 8, the following describes the structure of the bottom face of the printer 1.

FIG. 6 is a perspective view of the printer 1 according to the present embodiment viewed from the bottom face. FIG. 7 is a bottom view of the printer 1 according to the present embodiment when a connector cover 109 is closed. FIG. 8 is a bottom view of the printer 1 according to the present embodiment when the connector cover 109 is open.

As shown in FIGS. 6 and 7, the printer 1 has legs 101 at four positions of the bottom face, and the legs protrude from the referential face 10Bs of the printer. These legs 101 are made of rubber or plastic, for example. Each leg 101 has a flat bottom face to stabilize the posture of the printer 1 when the printer is placed on the installation site.

The bottom face has a recess 107. The recess has a shape matching with a PCB housing 207 (see FIG. 9) of the battery unit 20 and with a PCB housing 307 of the cradle 30. That is, the recess 107 receives the PCB housing 207 when the user attaches the battery unit 20 to the printer 1 and receives the PCB housing 307 (see FIG. 15) when the user mounts the printer 1 on the cradle 30. The recess 107 has a depressed form relative to the referential face 10Bs so as to receive the PCB housings 207 and 307.

The bottom face has a recess 113. This recess has a depressed form relative to the referential face 10Bs so as to engage with a battery housing 213 of the battery unit 20 when the user attaches the battery unit 20 to the printer 1.

The bottom face has grooves 103 at four positions. These grooves are depressed from the referential face 10Bs, and engage with four protrusions 203 (see FIG. 9) of the battery unit 20 when the user attaches the battery unit 20 to the printer 1. In the present embodiment, the user may place the printer 1 and the battery unit 20 so as to insert the protrusions 203 into the grooves 103 and slide the printer 1 forward for engaging of the protrusions 203 and the grooves 103. Such engagement of the protrusions 203 and the grooves 103 limits the relative movement of the printer 1 and the battery unit 20 in the vertical direction.

The engagement of the grooves 103 and the protrusions 203 is described later in details.

The bottom face has a recess 111. When the grooves 103 and the protrusions 203 engage, this recess engages with a protrusion 211 (see FIG. 9) of the battery unit 20 to limit the relative movement of the printer 1 and the battery unit 20 in the front-rear direction. Such engagement of the recess 111 and the protrusion 211 locks the printer 1 and the battery unit 20. Then the battery unit 20 cannot be detached from the printer 1 before the user manipulates a cancel unit 235 (see FIG. 13A) described later.

The bottom face has joints 105 close to the front end of the printer 1. These joints join with joints 305 (see FIG. 15) of the cradle 30 when the user directly mounts the printer 1 on the cradle 30. Each joint 105 has a protrusion 105a for latching-on by the claw of the corresponding joint 305 during joining with the joint 305.

As shown in FIG. 8, when the connector cover 109 is removed, the connector 115 is exposed. The connector 115 has a plurality of round electrical contacts formed on a flat substrate. When the user attaches the battery unit 20 to the printer 1, the connector 115 connects to a connector 215 (see FIG. 10) of the battery unit 20. When the user directly mounts the printer 1 on the cradle 30, the connector 115 connects to a connector 309 (see FIG. 16) of the cradle 30.

The connector 115 includes a first power-supply terminal and a second power-supply terminal.

The first power-supply terminal comes in contact with the external power-supply terminal (that receives predetermined DC voltage output from the AC adaptor) of the cradle 30 when the user directly mounts the printer 1 on the cradle 30. The first power-supply terminal receives the external power supply when the battery unit 20 is not attached to the printer 1. That is, the printer body has the power-terminal configured to receive the external power supply when a battery container (e.g., the battery unit 20) is not attached to the printer body.

The second power-supply terminal comes in contact with a power-supply terminal (described later) of the battery unit 20 when the battery unit 20 is attached to the printer 1.

(3) Battery Unit 20

Figure 9:
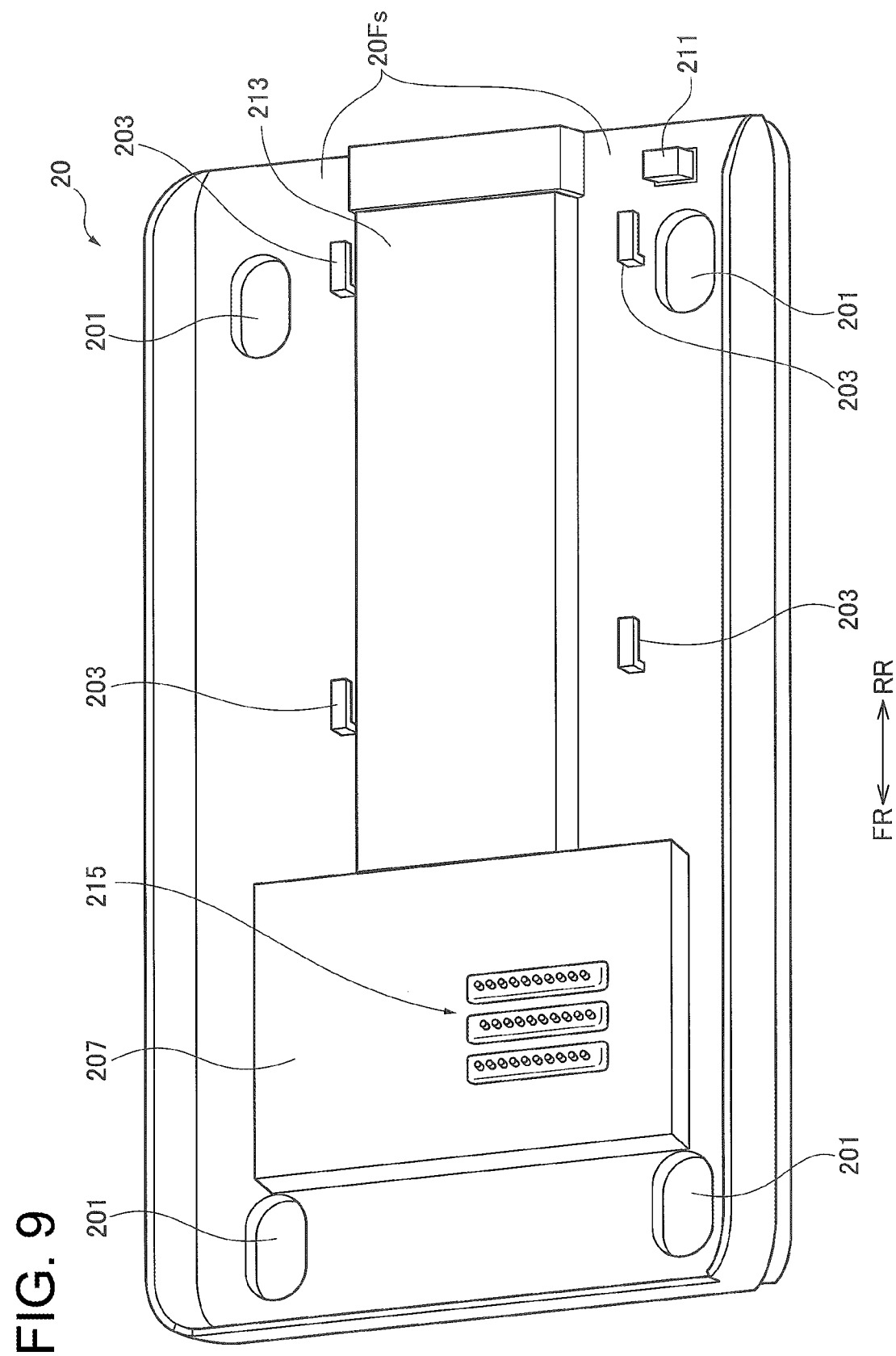
FIG. 9 is a perspective view of a battery unit according to one embodiment.
Figure 10:
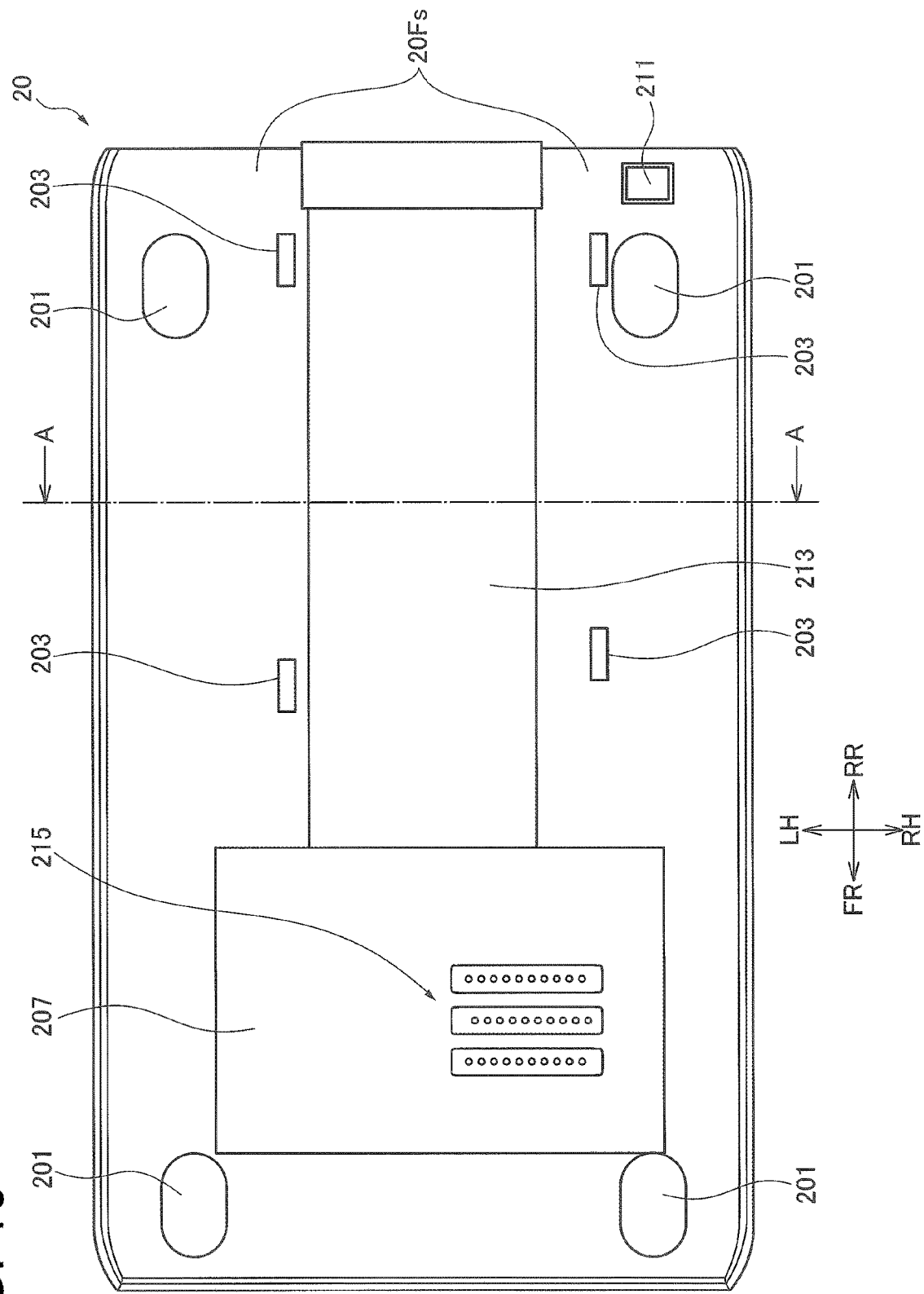
FIG. 10 is a plan view of a battery unit according to one embodiment.
Figure 11:
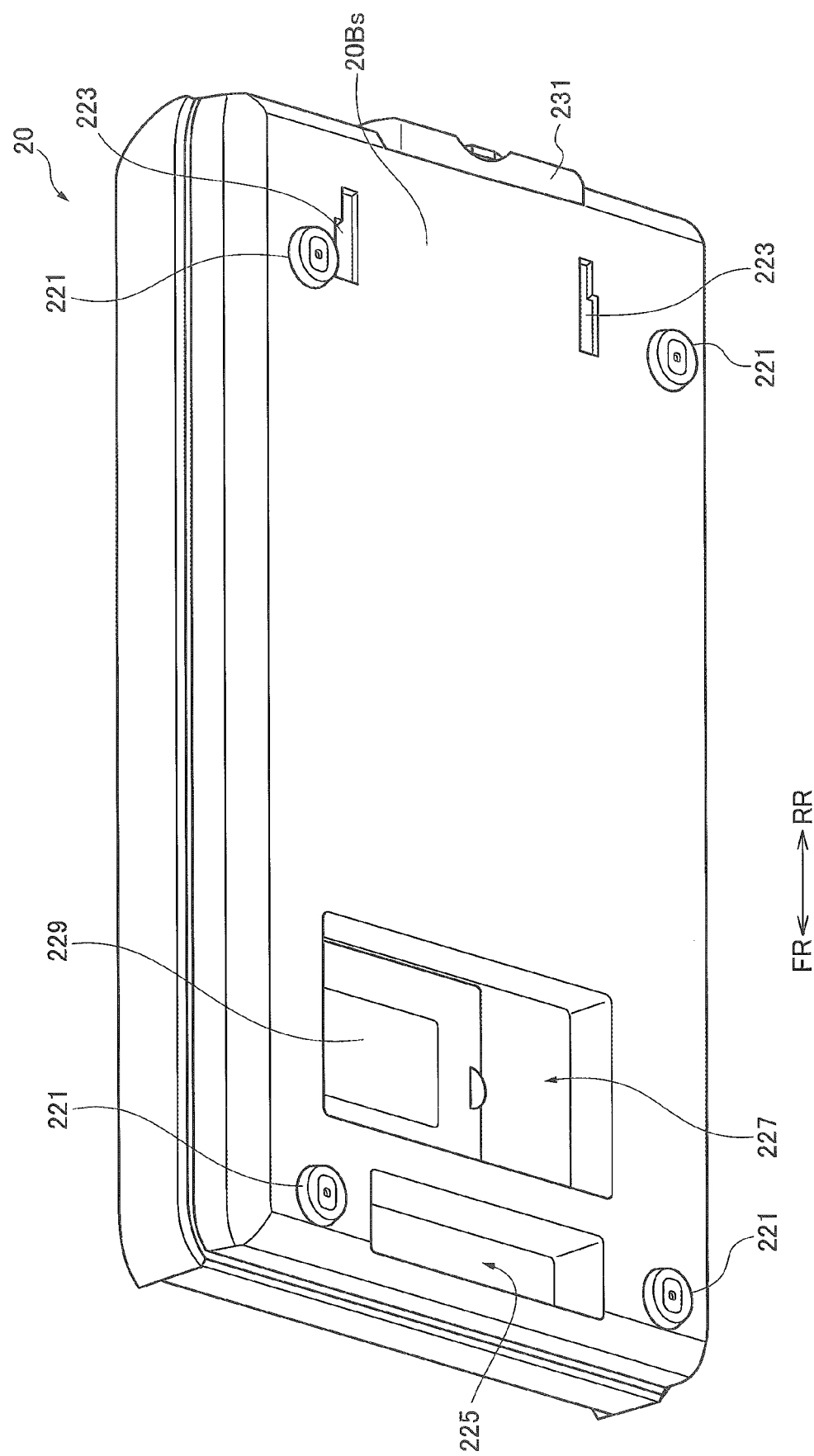
FIG. 11 is a perspective view of a battery unit according to one embodiment viewed from the bottom face.
Figure 12:
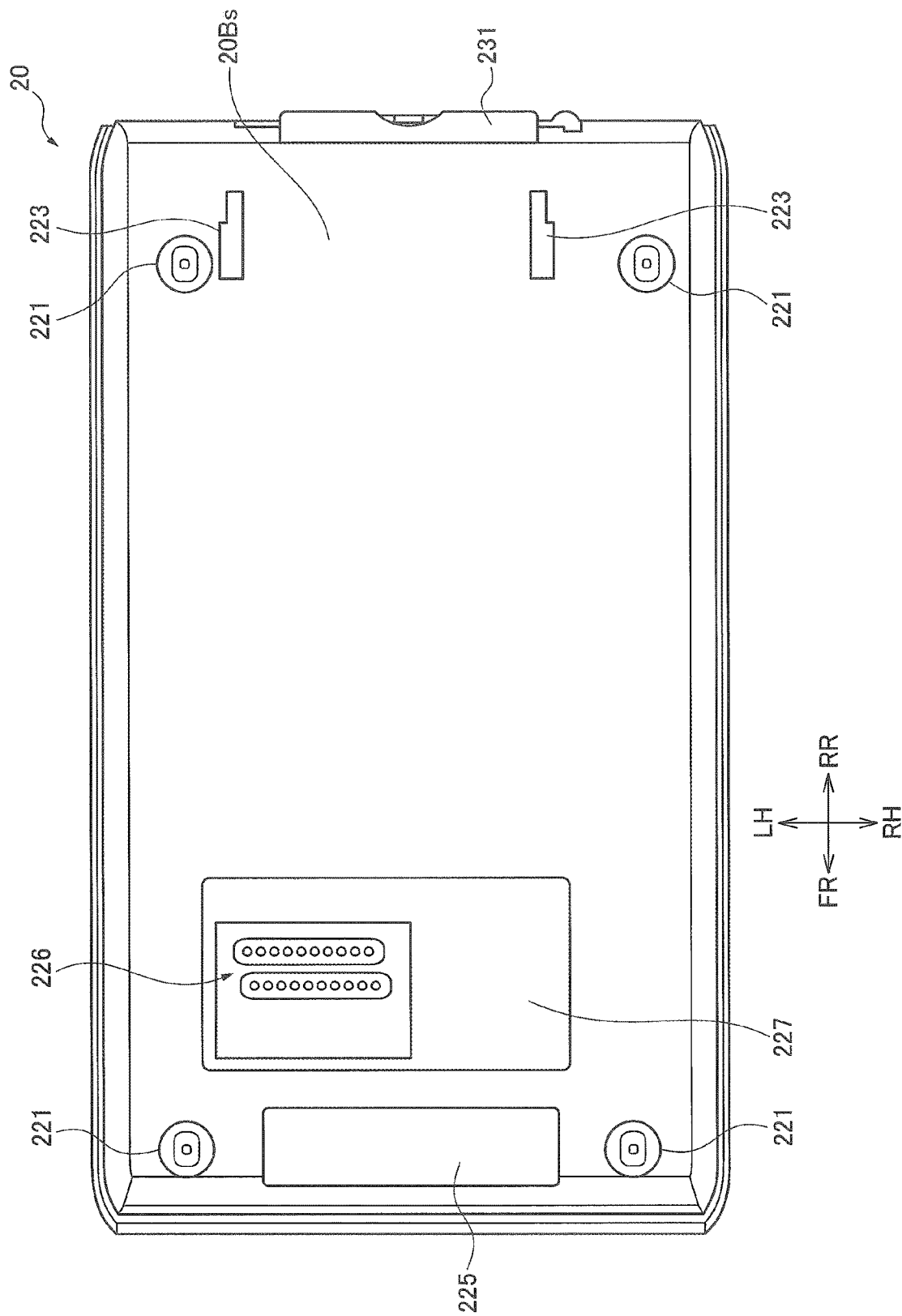
FIG. 12 is a bottom view of a battery unit according to one embodiment.

Referring next to FIGS. 9 to 14, the following describes the battery unit 20. FIG. 9 is a perspective view of the battery unit 20 according to the present embodiment. FIG. 10 is a plan view of the battery unit 20 according to the present embodiment. FIG. 11 is a perspective view of the battery unit 20 according to the present embodiment viewed from the bottom face. FIG. 12 is a bottom view of the battery unit 20 according to the present embodiment. FIG. 12 shows a connector cover 229 that is open to expose a connector 226.

Figure 13A:
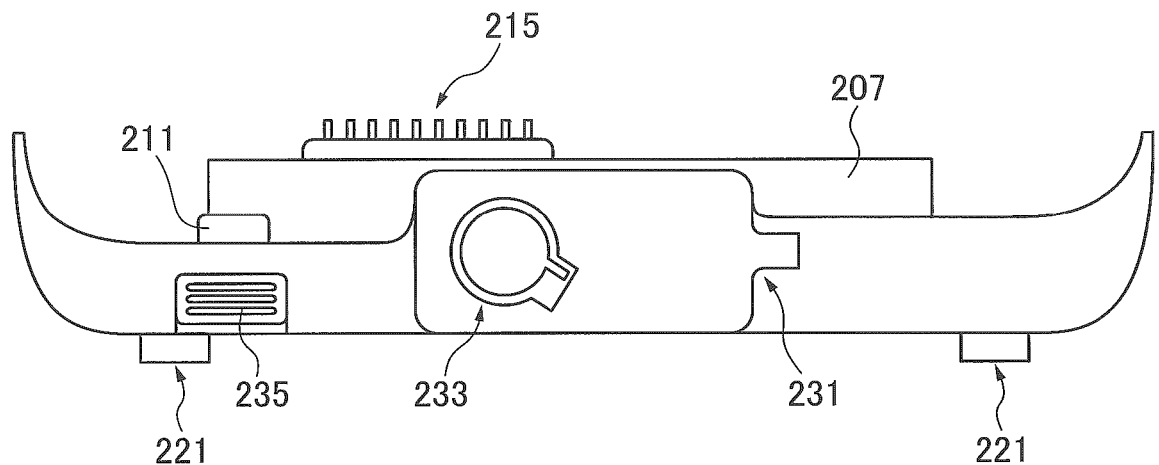
FIG. 13A is a rear view of a battery unit according to one embodiment.
Figure 13B:
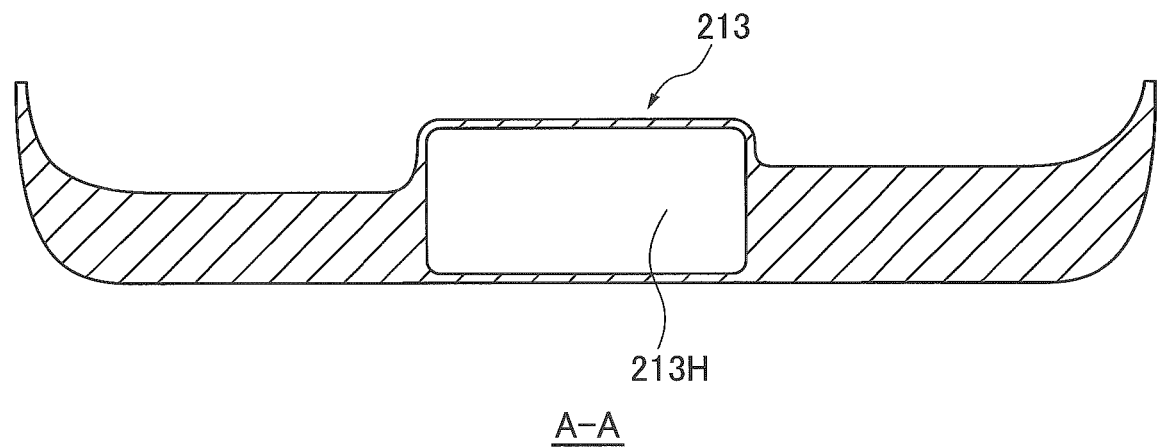
FIG. 13B is a cross-sectional view taken along line A-A of FIG. 10.
Figure 14A:
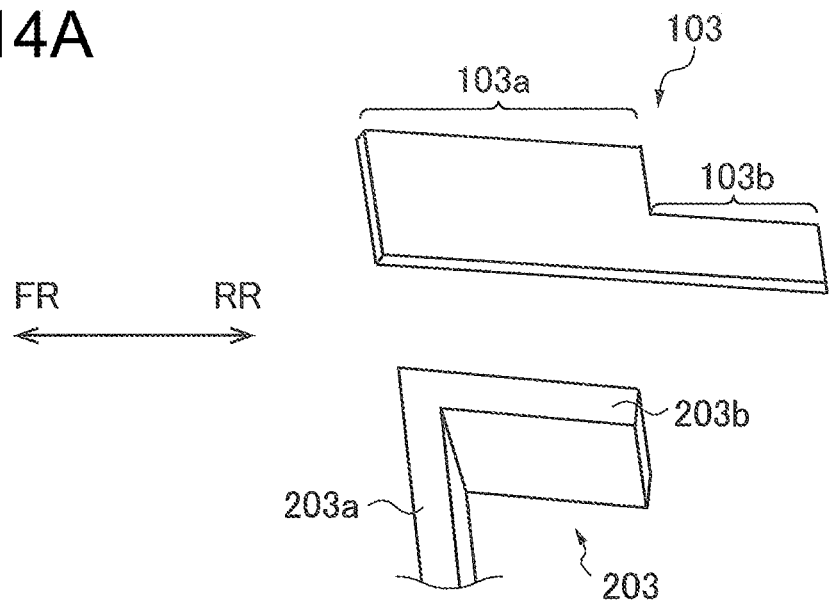
FIGS. 14A to 14C explain the engagement of a printer and a battery unit in the order of procedure.
Figure 14B:
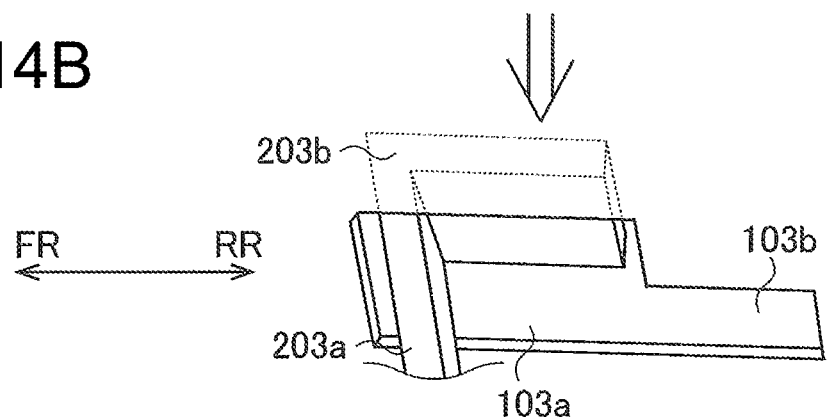
Figure 14C:
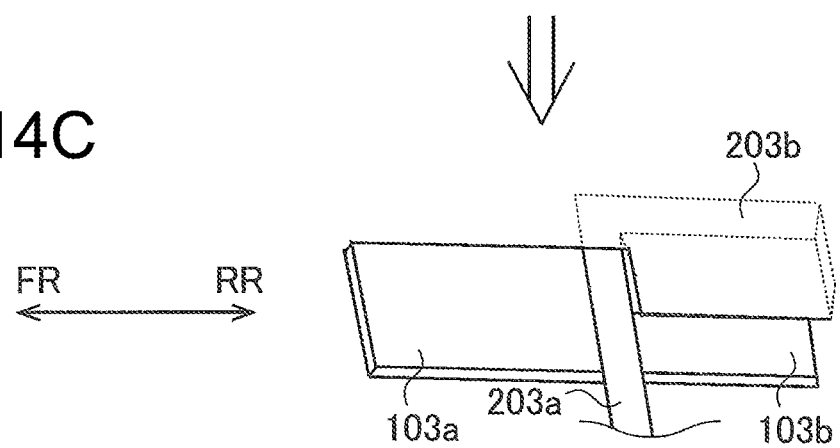

FIG. 13A is a rear view of the battery unit 20 according to the present embodiment. FIG. 13B is a cross-sectional view taken along line A-A of FIG. 10. FIGS. 14A to 14C explain the engagement of the printer 1 and the battery unit 20 in the order of procedure.

As shown in FIGS. 9 and 10, the battery unit 20 has an upper face, and the upper face has leg-receiving parts 201 at four positions that are depressed from the referential face 20Fs. These leg-receiving parts 201 receive the legs 101 of the printer 1 when the battery unit 20 is attached to the printer 1. As described later, each leg-receiving part 201 has an elliptic shape having the major axis along the front-rear direction so as to allow the movement of the printer 1 in the front-rear direction on the battery unit 20 for attachment and detachment of the printer 1.

The PCB housing 207 stores a printed circuit board internally and has a shape matching with the shape of the bottom face of the printer 1. That is, when the user attaches the battery unit 20 to the printer 1, this PCB housing is inserted into the recess 107 (see FIG. 6) of the printer 1.

On the upper face of the PCB housing 207, the connector 215 is provided. The connector 215 connects to the print circuit board stored in the PCB housing 207. The connector 215 includes a plurality of pin-shaped terminals that protrude upward. When the user attaches the battery unit 20 to the printer 1, the connector 215 connects to the connector 115 (see FIG. 8) of the printer 1.

The terminals of the connector 215 include a power-supply terminal that connects to the battery in the battery housing 213. The power-supply terminal comes in contact with the second power-supply terminal of the connector 115 of the printer 1 when the battery unit 20 is attached to the printer 1. A contact of the power-supply terminal of the connector 215 and the second power-supply terminal of the connector 115 supplies the battery power to the printer 1.

The protrusions 203 at four positions protrude from the referential face 20Fs. These protrusions engage with the grooves 103 (see FIG. 6) at four positions of the printer 1 when the user attaches the battery unit 20 to the printer 1. As described above, the user may place the printer 1 and the battery unit 20 of the present embodiment so as to insert the protrusions 203 into the grooves 103 and slide the printer 1 forward for engaging of the protrusions 203 and the grooves 103. Such engagement of the protrusions 203 and the grooves 103 attaches the battery unit 20 to the printer 1.

Referring to FIG. 14, the following describes the engagement of the protrusions 203 and the grooves 103.

FIGS. 14A to 14C show the protrusions 203 and the grooves 103 in the order of procedure for engagement when the user moves the printer 1 relative to the battery unit 20 to attach the battery unit 20 to the printer 1. FIGS. 14A to 14C show the protrusions 203 and the grooves 103 from the same point of view as in the perspective view of FIG. 6 (i.e., perspective view from the bottom face of the printer 1).

FIG. 14A shows the protrusion and the groove immediately before the user places the bottom face of the printer 1 on the upper face of the battery unit 20. As shown in FIGS. 6 and 14A, each groove 103 of the printer 1 has a relatively wide groove 103a located forward and a relatively narrow groove 103b located backward. As shown in FIGS. 9 and 14A, each protrusion 203 has a leg 203a protruding from the referential face 20Fs and an engagement part 203b extending backward from the leading end of the leg. The engagement part 203b has a width set between the width of the narrow groove 103b and the wide groove 103a.

As shown in FIG. 14B, the user directs the bottom face of the printer 1 toward the upper face of the battery unit 20 and moves the printer downward to insert the engagement part 203b of the protrusion 203 into the wide groove 103a of the groove 103.

Next, the user slides the printer 1 backward relative to the battery unit 20. Then as shown in FIG. 14C, the engagement part 203b of the protrusion 203 moves backward inside of the printer 1 to fit into the narrow groove 103b of the groove 103. The width of the engagement part 203b is wider than the width of the narrow groove 103b, and therefore the fitting of them limits the relative movement of the printer 1 and the battery unit 20 in the vertical direction. FIG. 14C shows the engagement of the protrusion 203 and the groove 103.

This corresponds to the battery unit 20 attached to the printer 1 so that the bottom face of the printer 1 is opposed to the upper face of the battery unit 20.

Referring again to FIGS. 9 and 10, when the protrusions 203 and the grooves 103 engage, the protrusion 211 engages the recess 111 (see FIG. 6) of the printer 1 to limit the relative movement of the printer 1 and the battery unit 20 in the front-rear direction. The protrusion 211 can move between a not-protruding position where the protrusion does not protrude from the referential face 20Fs and a protruding position where the protrusion protrudes from the referential face 20Fs. The protrusion 211 is biased to the protruding position. Therefore, when the printer 1 is not mounted on the protrusion 211, the protrusion is at the protruding position as shown in FIG. 9.

When the user moves the printer toward the battery unit 20 downward to mount the printer on the battery unit 20, i.e., when they are in the state of FIG. 14B, the referential face 10Bs of the bottom face of the printer 1 abuts with the protrusion 211. This moves the protrusion 211 to the not-protruding position.

Next as shown in FIG. 14C, the user slides the printer 1 backward relative to the battery unit 20 until the recess 111 of the printer 1 is opposed to the protrusion 211. Then the protrusion 211 moves to the protruding position due to the biasing force. As a result, the recess 111 and the protrusion 211 engage so as to limit the movement of the printer 1 relative to the battery unit 20 in the front-rear direction. That is, the printer 1 and the battery unit 20 are locked.

The following describes the features (i) to (iii) of the battery unit 20 attached to the printer 1 of the present embodiment.

(i) In the present embodiment, the outer edge of the bottom face of the printer 1 shown in FIG. 7 coincides with the outer edge of the bottom face of the battery unit 20 shown in FIG. 12. That is, as shown in FIG. 2, when the battery unit 20 is attached to the printer 1, their outer edges of the printer 1 and the battery unit 20 coincide with each other. This means that the upper face of the battery unit 20 is disposed to cover the entire bottom face of the printer 1 in a plan view, and therefore the printer 1 having the battery unit 20 attached can stand stably.

The printer 1 of the present embodiment does not have to internally have a battery housing to store the battery. The printer 1 therefore can be small when the battery unit 20 is removed from the printer. Since the outer edges of the bottom face of the printer 1 and of the bottom face of the battery unit 20 coincide with each other, the printer 1 having the battery unit 20 attached also can be small as a whole, and so a user can easily carry them as one unit.

(ii) In the present embodiment, the battery unit 20 is attached to the printer 1 by bringing the referential face 20Fs of the upper face of the battery unit 20 into a face-to-face contact with the referential face 10Bs of the bottom face of the printer 1. A difference in height between the referential face 20Fs of the upper face of the battery unit 20 and the bottom faces of the legs 221 of the battery unit 20 is constant. Therefore, the display panel 4 can keep the same inclined angle relative to a mounting face (e.g., a horizontal face or the upper face of the cradle 30) between when the printer 1 is placed on the face and when the printer 1 having the battery unit 20 attached is placed on the face. This can lead to an advantageous effect of keeping the operability and visibility of the display panel 4 of a user irrespective of the attachment or not of the battery unit 20.

(iii) As shown in FIG. 10, the battery housing 213 to store a relatively heavy battery is disposed close to the center in a plan view. This leads to an advantageous effect of the printer 1 having good stability when the battery unit 20 is attached to the printer and the printer is installed with the battery unit 20 at the bottom.

Referring next to FIG. 13A, the cancelling unit 235 is provided at the rear end of the battery unit 20. The canceling part 235 is a lever to cancel the locking of the printer 1 and the battery unit 20. When the user slides the canceling unit 235 downward, the protrusion 211 moves correspondingly to the not-protruding position, so as to enable the relative movement of the recess 111 to the protrusion 211 in the front-rear direction. Therefore, the user may move the printer 1 forward relative to the battery unit 20 while manipulating the canceling part 235, whereby the user can remove the battery unit 20 from the printer 1.

The present specification does not provide any description about the structure to generate a force against the biasing force to the protrusion 211 by manipulating the canceling part 235, and a person skilled in the art can design such a structure as needed.

As shown in FIG. 13A, the battery unit 20 has the battery cover 231 at the rear end to open or close the battery housing 213. A lever 233 locks the battery cover 231 and cancels the locking.

As shown in FIG. 13B, the interior of the battery housing 213 is a hollow 213H to store a battery.

Referring to FIGS. 11 and 12, the battery unit 20 has legs 221 at four positions of the bottom face, and the legs protrude from the referential face 20Bs. Each leg 221 has a flat bottom face to stabilize the posture of the battery unit 20 attached to the printer 1 when they are placed on the installation site. That is, both of the bottom face of the printer body and the bottom face of the battery container (e.g., the battery unit 20) have a flat face.

These legs 221 are made of rubber or plastic, for example.

The recess 227 has a shape matching with the shape of the cradle 30. That is, when the battery unit 20 is mounted on the cradle 30, the recess 227 has a depressed form relative to the referential face 20Bs so as to receive the PCB housings 307 (see FIG. 15) of the cradle 30.

A connector cover 229 is located in the recess 227 to open or close the connector 226 (see FIG. 12). The connector 226 includes a plurality of round electrical contacts formed on a flat substrate. The connector 226 connects to a connector 309 (see FIG. 15) of the cradle 30 when the battery unit 20 is placed on the cradle 30.

The terminals of the connector 226 include a charging terminal to charge the battery in the battery housing 213. The charging terminal comes in contact with the external power-supply terminal (that receives predetermined DC voltage output from the AC adaptor) of the connector 309 of the cradle 30 when the battery unit 20 attached to the print 1 is placed on the cradle 30.

Grooves 223 at two positions are depressed from the referential face 20Bs, and these grooves are formed to receive protrusions 303 (see FIG. 15) at two positions of the cradle 30 when the battery unit 20 is mounted on the cradle 30. The protrusions 303 inserted into the grooves 223 inhibits the movement of the battery unit 20 relative to the cradle 30 in the front-rear direction, but the battery unit 20 in this state can be inserted to or removed from the cradle 30 in the vertical direction.

A recess 225 receives the joints 305 of the cradle 30 when the battery unit 20 is mounted on the cradle 30. Such a recess 225 allows the battery unit 20 not to join with the cradle 30 when the battery unit 20 is mounted on the cradle 30.

(4) Cradle 30

Referring next to FIGS. 15 to 21, the following describes the cradle 30.

(4-1) Overall Structure

Referring firstly to FIGS. 15 to 18, the following describes the overall structure of the cradle 30.

Figure 15:
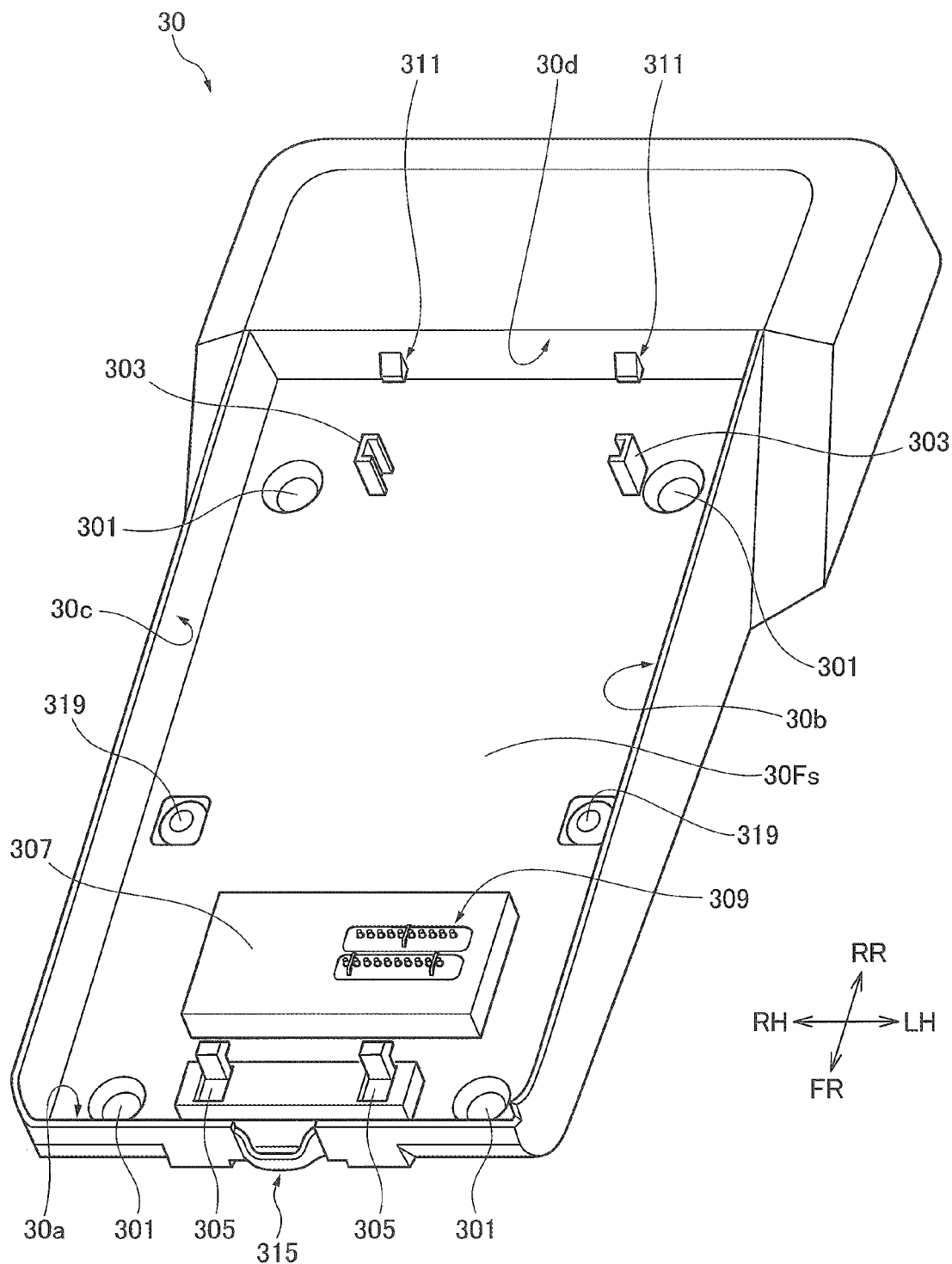
FIG. 15 is a perspective view of a cradle according to one embodiment.
Figure 16:
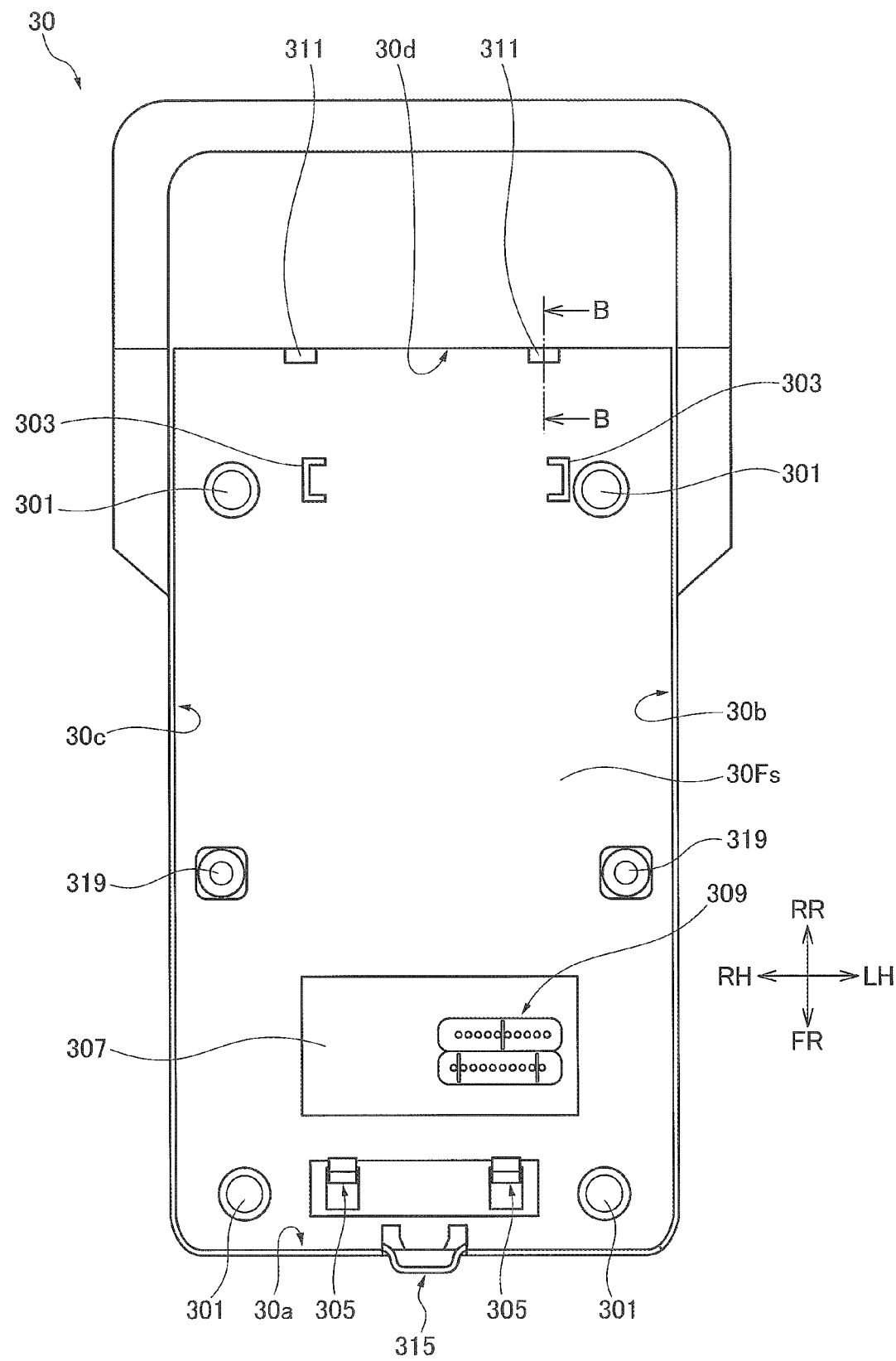
FIG. 16 is a plan view of a cradle according to one embodiment.
Figure 17:
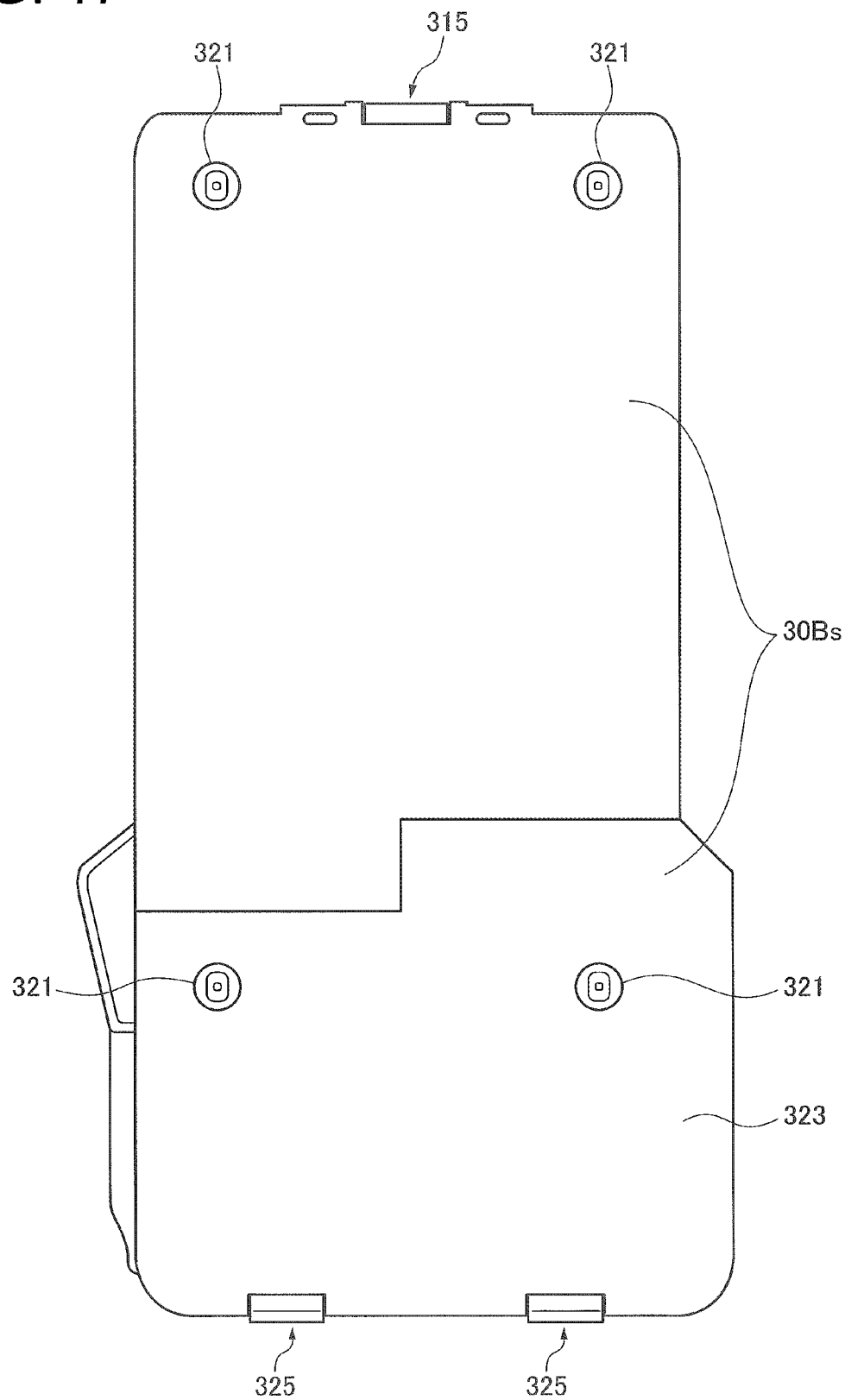
FIG. 17 is a bottom view of a cradle according to one embodiment.
Figure 18:
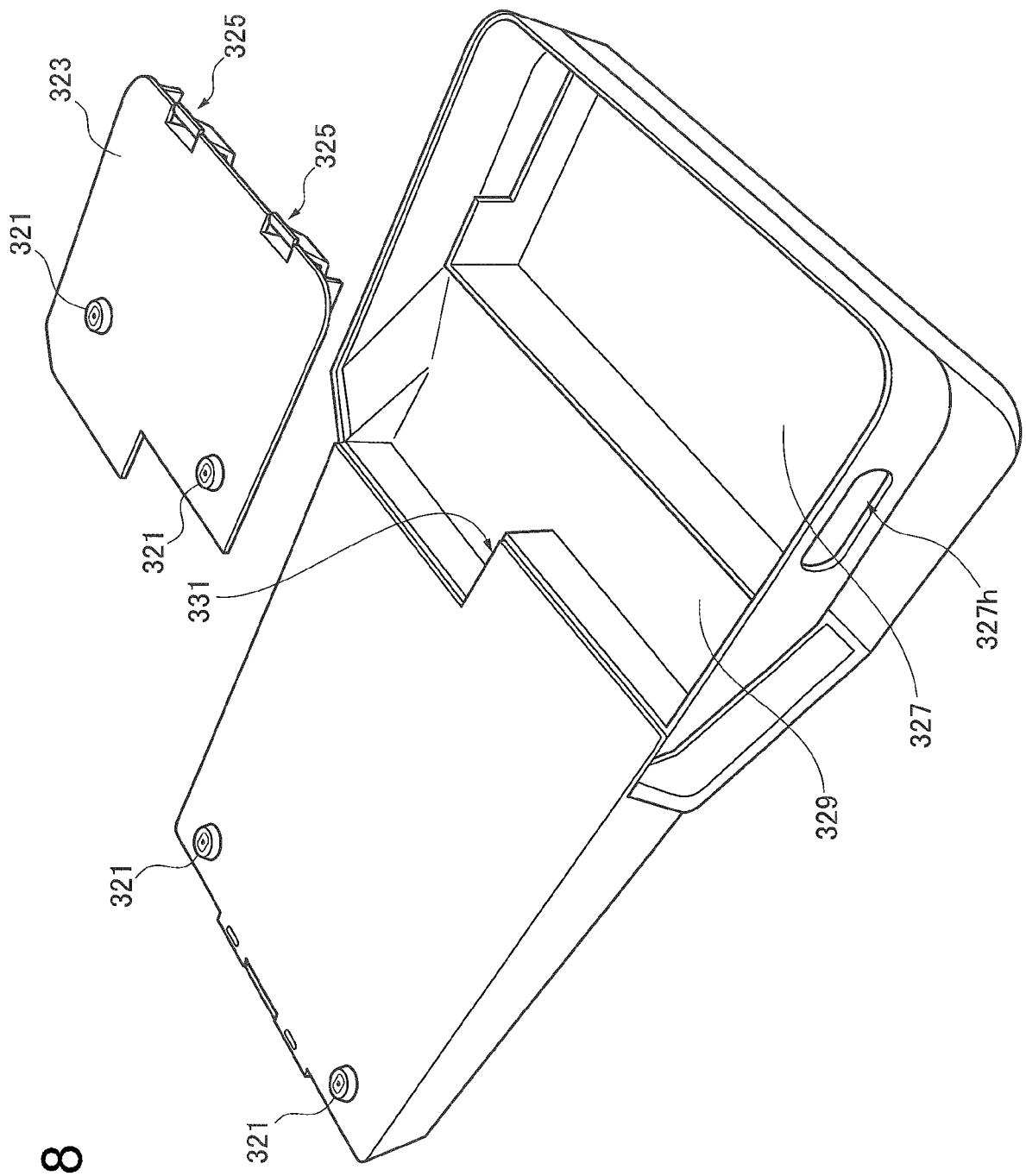
FIG. 18 is a perspective view of a cradle according to one embodiment viewed from the bottom face when the cover is removed.
Figure 19:
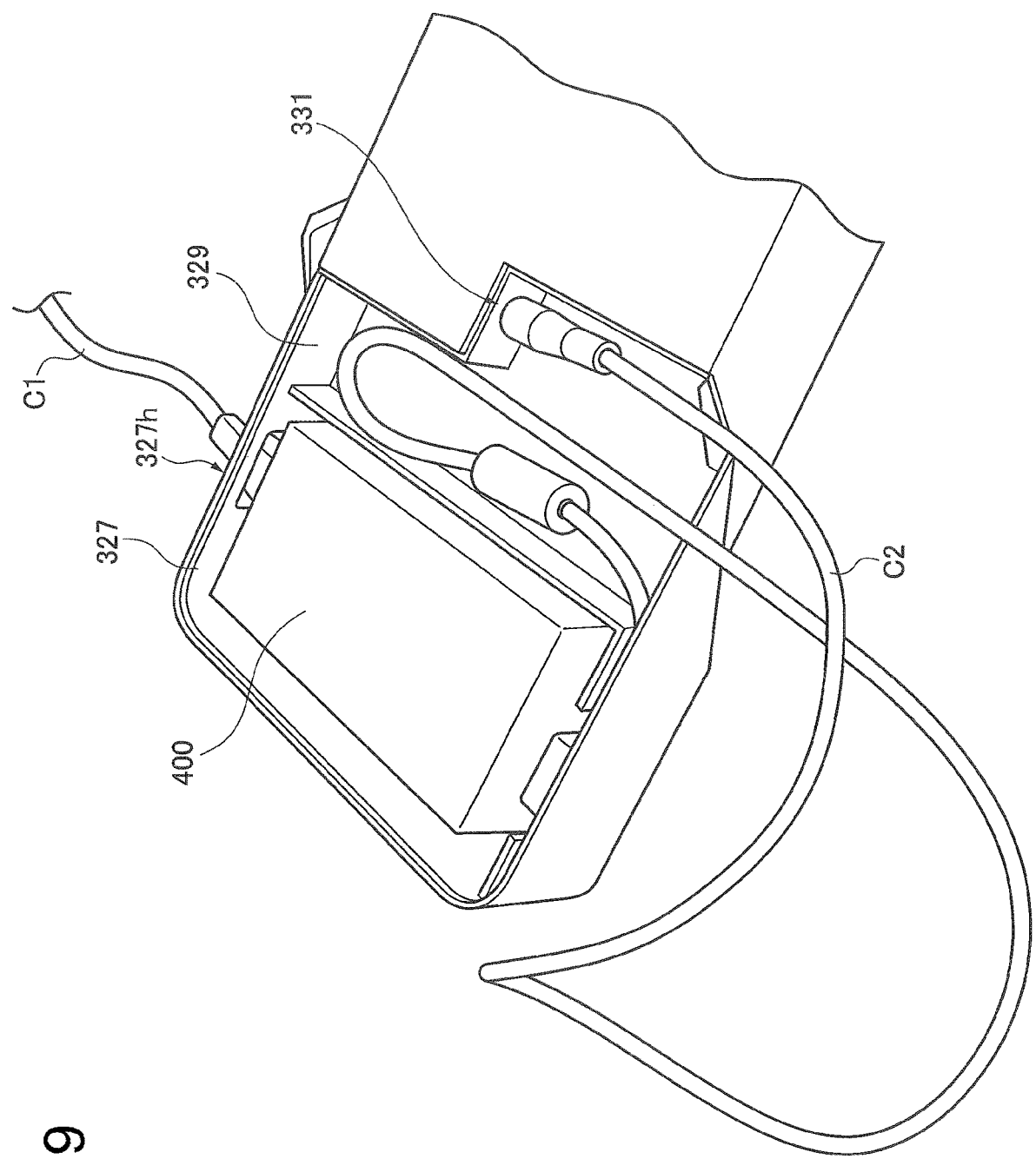
FIG. 19 is a perspective view of a cradle according to one embodiment storing the AC adaptor.

FIG. 15 is a perspective view of the cradle 30 according to the present embodiment. FIG. 16 is a plan view of the cradle 30 according to the present embodiment. FIG. 17 is a bottom view of the cradle 30 according to the present embodiment. FIG. 18 is a perspective view of the cradle 30 according to the present embodiment viewed from the bottom face when the cover is removed. FIG. 19 is a perspective view of the cradle 30 according to the present embodiment storing the AC adaptor.

As shown in FIGS. 15 and 16, the cradle 30 has a front end wall 30a, a left side wall 30b, a right side wall 30c and a rear end wall 30d so as to surround the referential face 30Fs from the above, and these walls are to place the printer 1 or the battery unit 20 stably.

The upper face of the cradle 30 has round leg-receiving parts 301 at four positions, and these leg-receiving parts are depressed from the referential face 30Fs. The leg-receiving parts 301 receive the legs 101 of the printer 1 or the legs 221 of the battery unit 20 when the printer 1 or the battery unit 20 is mounted on the cradles 30.

The PCB housing 307 stores a print circuit board internally and has a shape matching with the shape of the printer 1 or the battery unit 20. That is, the PCB housing 307 protrudes from the referential face 30Fs so as to be inserted into the recess 107 of the printer 1 when the printer 1 is mounted on the cradle 30 and so as to be inserted into the recess 227 of the battery unit 20 when the battery unit 20 is mounted on the cradle 30. When the battery unit 20 is mounted on the cradle 30, the bottom face of the battery unit 20 faces the upper face of the cradle 30.

On the upper face of the PCB housing 307, a connector 309 is provided. The connector 309 connects to the print circuit board stored in the PCB housing 307. The detailed structure of the connector 309 is described later, and any one of the terminals of the connector 309 includes the external power-supply terminal as stated above. When the printer 1 is mounted on the cradle 30, the connector 309 connects to the connector 115 of the printer 1. When the battery unit 20 is mounted on the cradle 30, the connector 309 connects to the connector 226 of the battery unit 20.

Two protrusions 303 protrude from the referential face 30Fs. When the printer 1 is mounted on the cradle 30, the protrusions 303 are inserted into two rear grooves 103 of the four grooves 103 of the printer 1. When the battery unit 20 is mounted on the cradle 30, the protrusions 303 are inserted into the grooves 223 on the bottom face of the battery unit 20. The protrusions 303 can be inserted into and removed from between the grooves 103 and the grooves 223.

As shown in FIGS. 15 and 16, protrusions 311 protrude forward from the rear end wall 30d of the cradle 30. When the printer 1 is mounted on the cradle 30, the protrusions 311 engage with a groove 121 of the printer 1 at the rear end. Engagement of the protrusions 311 and the groove 121 is described later.

The cradle 30 has the joints 305 close to the front end, and the joints 305 join with the joints 105 (see FIG. 6) of the printer 1 when the user directly mounts the printer 1 on the cradle 30.

The cradle has a cancel lever 315, and the cancel lever is a part for a user to cancel the joining of the joints 305 and the joints 105 of the printer 1. The cancel lever 315 is disposed at the front end wall 30a of the cradle 30 for better operability.

Joining of the joints 305 and the joints 105 and canceling of the joining are described later.

Elastic members 319 are disposed at two positions close to the right end wall 30c and the left side wall 30b, and the elastic members protrude upward from the referential face 30Fs. These elastic members 319 bias the bottom face of the printer 1 upward when the printer 1 is mounted on the cradle 30, so as to enhance the joining of the joints 305 and the joints 105 of the printer 1. This also is described later.

As shown in FIG. 17, the cradle 30 has legs 321 at four positions of the bottom face, and the legs protrude from the referential face 30Bs. These legs 321 are made of rubber or plastic, for example, and are to stabilize the posture of the cradle 30 when the cradle is placed on the installation site.

In the example of the present embodiment, two legs 321 of the four legs 321 are disposed at a cover 323. In another example, the legs 321 may be disposed at any positions on the referential face 30Bs.

The cradle 30 has the cover 323 at a rear part of the bottom face. As shown in FIG. 18, the cover 323 closes or opens an adaptor housing 327 to store an AC adaptor and a cable housing 329 to store a cable. Claws 325 at two positions engage with the body of the cradle to close the cover 323. The cover 323 can be open by cancelling the engagement with the claws 325.

FIGS. 18 and 19 show the adaptor housing 327 and the cable housing 329 that are open by removing the cover 323. FIG. 18 does not show the AC adaptor and the cable.

As shown in FIGS. 18 and 19, the adaptor housing 327 has an opening 327h to let a cable C1 pass through to connect it to an AC adaptor 400 stored in the adaptor housing 327. The cable C1 connects a commercial power (not illustrated) and the AC adaptor 400 to supply AC voltage from the commercial power to the AC adaptor 400.

The cable housing 329 accommodates a connector 331, and cable C2 connects the AC adaptor 400 and the connector 331. The cable C2 supplies a predetermined DC voltage from the AC adaptor 400 to an external power-supply terminal of the connector 331 of the cradle 30.

(4-2) Structure of Connector

Figure 20:
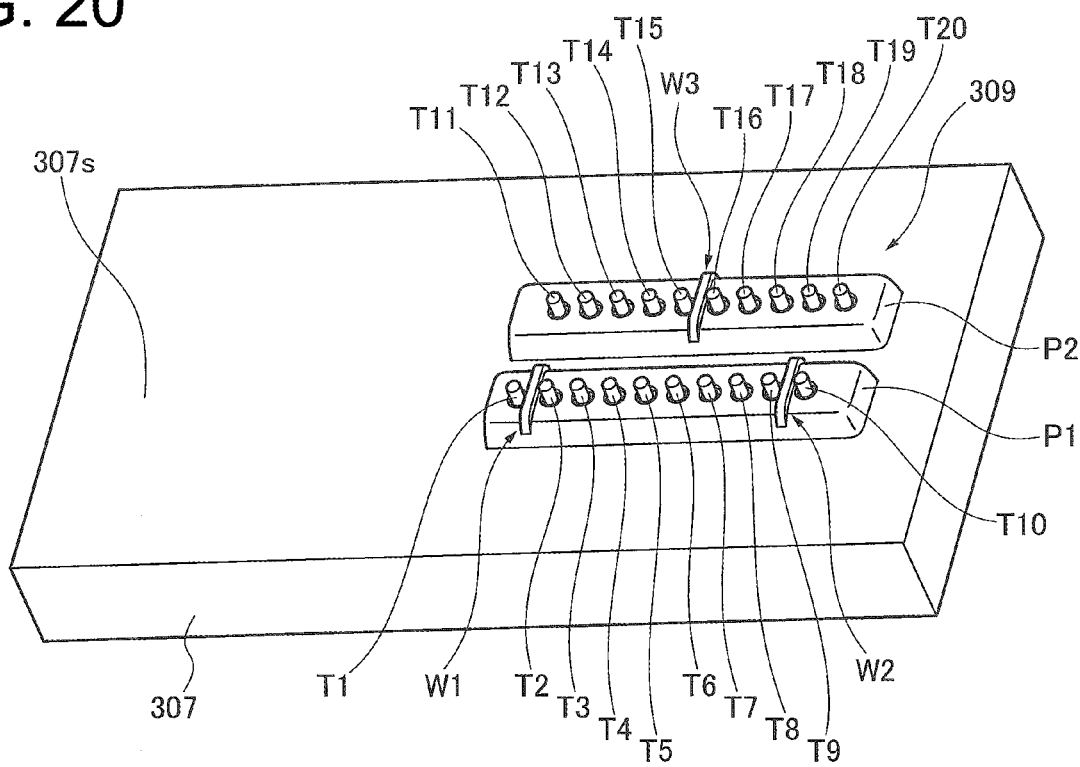
FIG. 20 is a perspective view of a connector of a cradle according to one embodiment.
Figure 21:
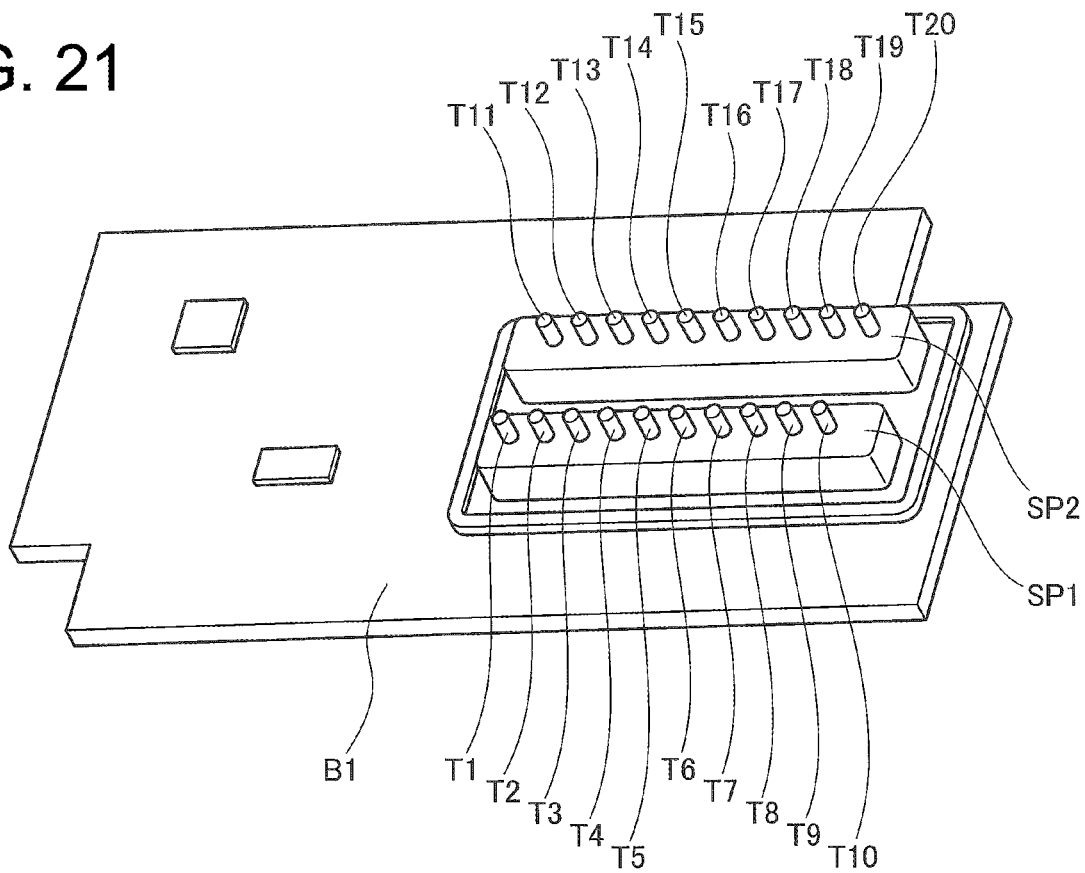
FIG. 21 shows the interior of a PCB housing of a cradle according to one embodiment.

Referring next to FIGS. 20 and 21, the following describes the structure of the connector 309 of the cradle 30.

FIG. 20 is a perspective view of the connector 309 of the cradle 30 according to the present embodiment. FIG. 21 shows the interior of the PCB housing 307 of the cradle 30 according to the present embodiment.

As shown in FIG. 20, bumps P1, P2 are formed at the PCB housing 307 of the cradle 30. The bumps P1, P2 stands from the referential face 307s of the PCB housing 307. The referential face 307s faces the printer 1 or the battery 20 when the printer 1 or the battery 20 to be mounted is mounted on the cradle.

A plurality of terminals T1 to T10 is provided at the bump P1. The plurality of terminals T1 to T10 includes a terminal for electrical connection with the printer 1 or the battery unit 20. A plurality of terminals T11 to T20 is provided at the bump P2. The plurality of terminals T11 to T20 includes a terminal for electrical connection with the printer 1 or the battery unit 20.

These bumps P1, P2 prevent short-circuit between the terminals induced from liquid (e.g., water) that may enter into the upper face of the cradle 30.

The bumps P1, P2 have protrusions W1 to W3 protruding from their surfaces. Each protrusion is disposed between the terminals among the plurality of terminals T1 to T20, to which different voltages are applied.

In an example of the terminal arrangement of the connector 309 of the present embodiment, power-supply voltage is applied to terminals T1, T11 to T15, terminals T10, T16 to T20 are GND (ground) terminals, and a predetermined signal is applied to at least a part of terminals T2 to T9. Therefore, protrusion W1 is disposed between terminal T1 for the power-supply voltage and terminal T2 for a predetermined signal (i.e., different voltages are applied to these terminals). Protrusion W2 is disposed between terminal T9 for a predetermined signal and GND terminal T10 (i.e., different voltages are applied to these terminals). Protrusion W3 is disposed between terminal T15 for the power-supply voltage and GND terminal T16 (i.e., different voltages are applied to these terminals).

These protrusions W1 to W3 are disposed to block liquid flowing over the surface of the bumps P1 and P2 when the liquid exists on the surface of the bumps P1 and P2. This prevents the short-circuit induced between terminals more reliably.

In the example of FIG. 20, the protrusions W1 to W3 define walls standing from the surfaces of the bumps P1, P2 and the faces of the walls are opposed to the terminals. Such a wall of the protrusions W1 to W3 can block the flowing of liquid effectively while saving the space, and the shape of the protrusions is not limited to this. The protrusions may have any shape as long as they protrude so as to block the flowing of liquid between terminals on the surfaces of the bumps P1, P2.

Preferably the height of the protrusions W1 to W3 is as high as possible in terms of blocking of the flowing of liquid as long as they do not inhibit a contact to the terminals of the printer 1 or the battery unit 20 to be mounted. Preferably the protrusions W1 to W3 are formed across the entire width of the bumps P1, P2 in terms of blocking of the flowing of liquid.

When the connector includes a large number of terminals, the terminals are preferably arranged so that terminals having the same voltage applied are adjacent to each other, i.e., so that a plurality of terminals having the same voltage applied are concentrated. Since a serious problem about short-circuit will not occur between these adjacent terminals having the same voltage applied, such an arrangement of the terminals can minimize the number of the protrusions. Such a reduced number of the protrusions can save the space for the protrusions between terminals, and so the connector as a whole can be made compact.

Considering this, the connector 309 of the present embodiment has an arrangement such that power-supply voltage is applied to terminals T1, T11 to T15, terminals T10, T16 to T20 are GND terminals, and a predetermined signal may be applied to terminals T2 to T9.

As shown in FIG. 20, each of the terminals T1 to T20 in the connector 309 has a pin form, and protrudes in the direction orthogonal to the referential face 307s. The shape of each terminal is not limited to a pin form, but a pin form has an advantageous effect of less liquid remaining on the terminal after the liquid comes in contact with the terminal.

Preferably each of the plurality of terminals T1 to T20 having a pin form is biased in the direction away from the surfaces of the bumps P1, P2. The connector 309 connects to the connector 115 of the printer 1 or the connector 226 of the battery unit 20, and all of them are a plurality of round electrical contacts formed on a flat substrate. Therefore, each of the plurality of terminals T1 to T20 having a pin form is biased in the direction away from the surfaces of the bumps P1, P2, whereby the biased terminals of the connector 309 come in contact with the connector 115 or the connector 226. This results in the improvement in reliability of the electrical contact between the connector 309 and the connector 115 or the connector 226.

Any method to bias the terminals may be used, which may be a method using a coil spring or a leaf spring.

Referring to FIG. 21, the PCB housing 307 internally has a print circuit board B1, and the terminals connect to this print circuit board B1. In the vicinity of the print circuit board B1, the terminals are stored in a terminal container. Specifically, terminals T1 to T10 are stored in a terminal container SP1, and these terminals partially protrude from the terminal container SP1. Terminals T11 to T20 are stored in a terminal container SP2, and these terminals partially protrude from the terminal container SP2. Preferably the terminal containers SP1 and SP2 are filled with an inner member having elastomer. That is, the bumps P1 and P2 internally include the inner member having elastomer. Such an inner member can reliably prevent the short-circuit between terminals in the vicinity of the print circuit board B1.

(5) Operation of Mounting System 50

Referring next to FIGS. 22 to 24, the following describes the operation of the mounting system 50 in different situations. FIG. 22 describes the operation of an engagement mechanism 310, and FIGS. 23 and 24 describe the operation of a joint mechanism 300 of the cradle 30.

More specifically these drawings are as follows.

Figure 22A:
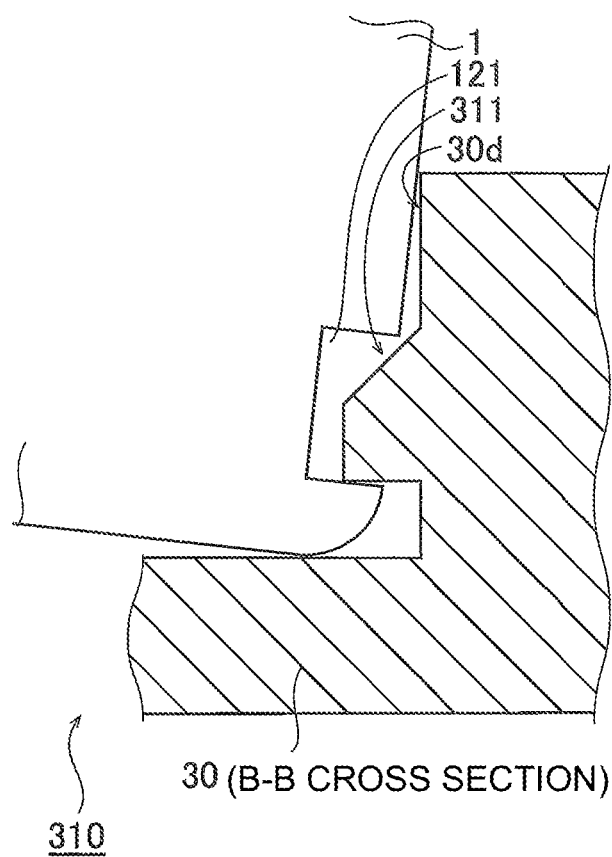
FIG. 22A is a cross-sectional view taken along B-B of FIG. 16, showing the printer that starts engaging with the cradle.
Figure 22B:
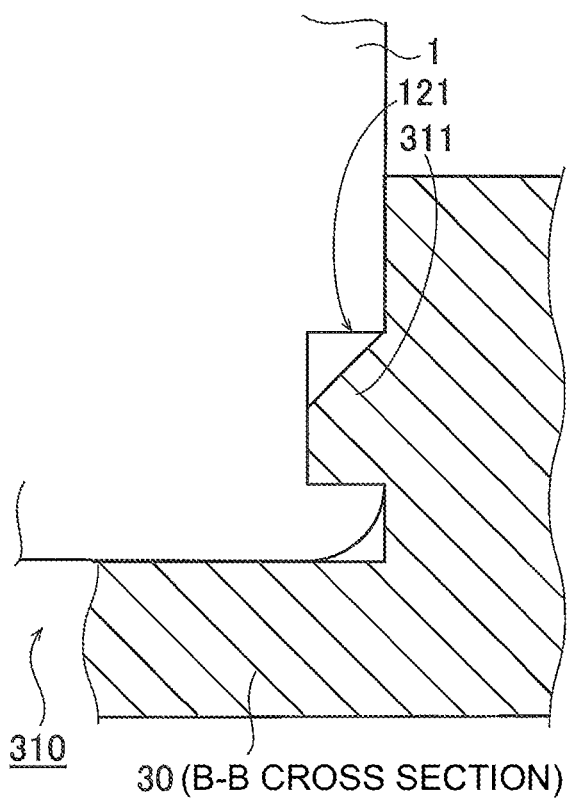
FIG. 22B is a cross-sectional view taken along B-B of FIG. 16, showing the printer completely engaging with the cradle.

FIG. 22A is a cross-sectional view taken along B-B of FIG. 16, showing the printer 1 that starts engaging with the cradle 30. FIG. 22B is a cross-sectional view taken along B-B of FIG. 16, showing the printer 1 completely engaging with the cradle 30.

Figure 23A:
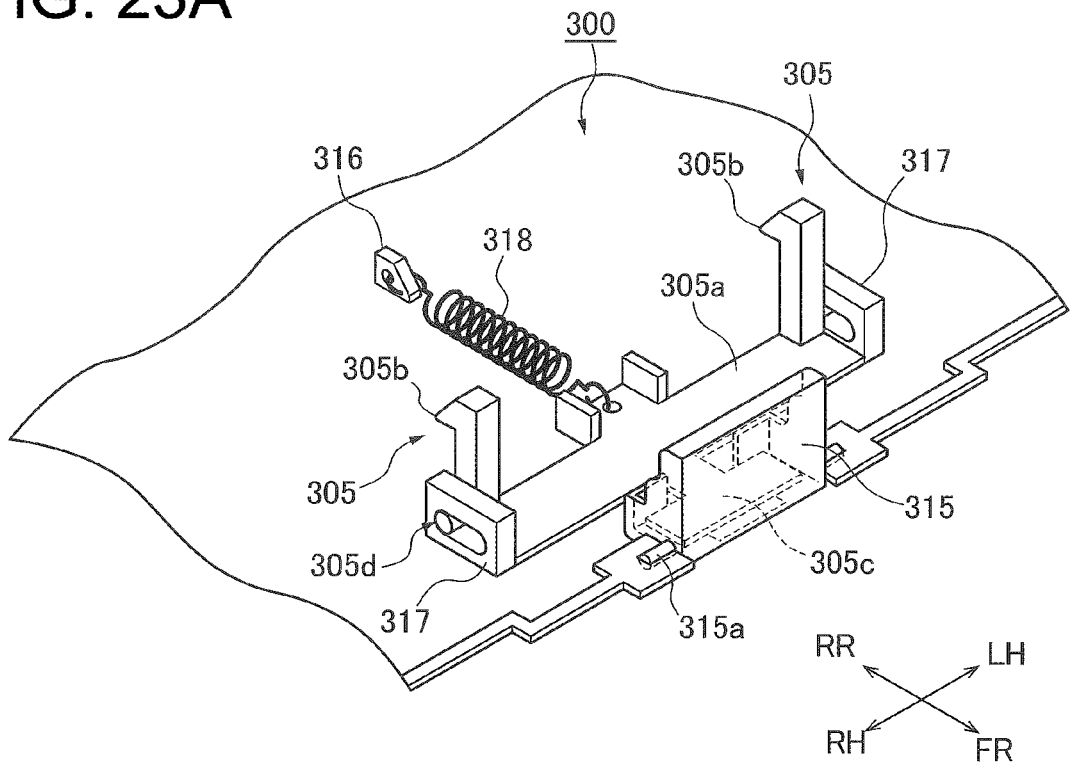
FIG. 23A describes the operation of a cancel lever of a cradle according to one embodiment when the user does not move the cancel lever.
Figure 23B:
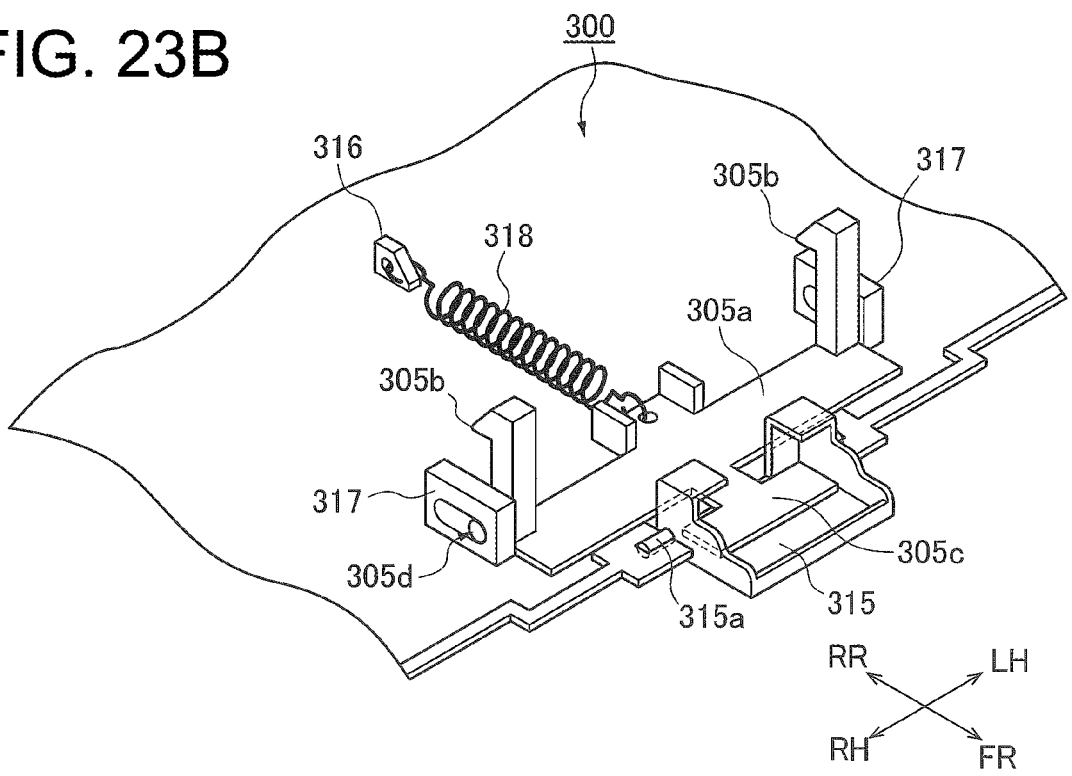
FIG. 23B describes the operation of a cancel lever of a cradle according to one embodiment after the user moved the cancel lever.
Figure 24A:
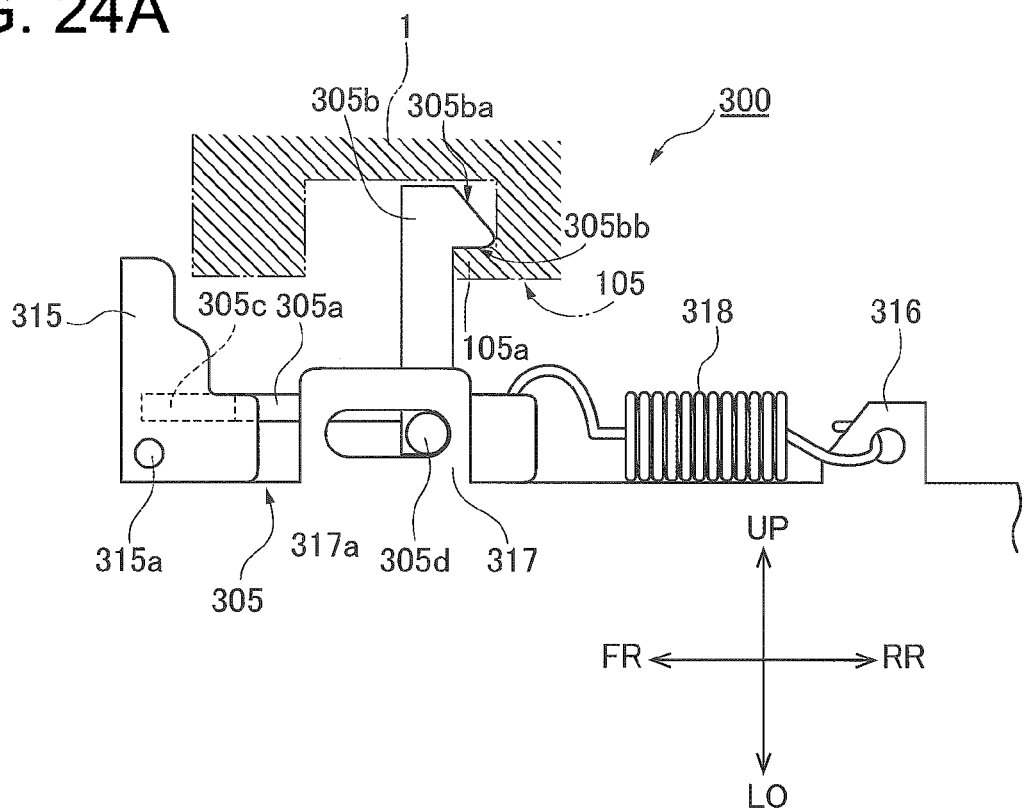
FIG. 24A describes the operation of a cancel lever of a cradle according to one embodiment when the user does not move the cancel lever.
Figure 24B:
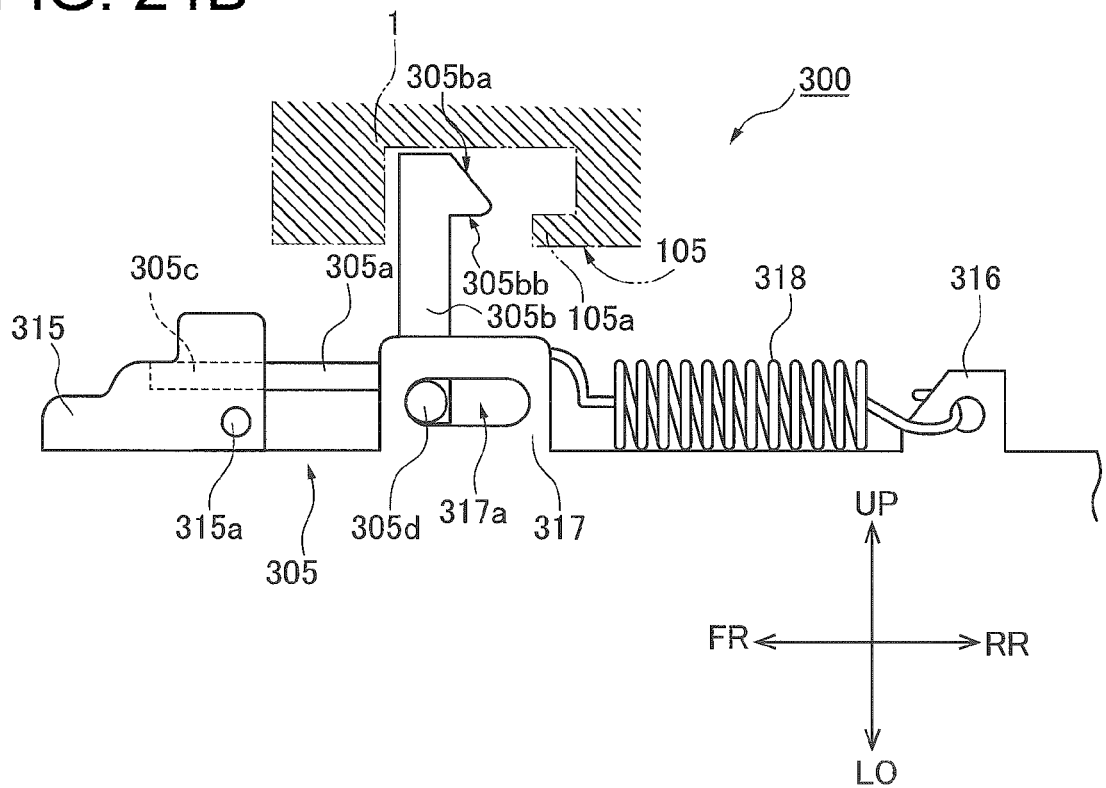
FIG. 24B describes the operation of a cancel lever of a cradle according to one embodiment after the user moved the cancel lever.

FIGS. 23A and 24A describe the operation of the cancel lever 315 of the cradle 30 according to the present embodiment when the user does not move the cancel lever 315. FIGS. 23B and 24B describe the operation of the cancel lever 315 of the cradle 30 according to the present embodiment after the user moved the cancel lever 315.

FIGS. 23A and 23B are perspective views of the inside of the cradle 30 around the cancel lever 315, and FIGS. 24A and 24B are side views of the inside of the cradle 30 around the cancel lever 315.

(5-1) Mounting Printer 1 without Battery Unit 20 on Cradle 30

Firstly, the following describes the operation to directly mount the printer 1 on the cradle 30.

As shown in FIG. 22A, when the printer 1 is directly mounted on the cradle 30, the user may slide the printer 1 backward using the left side wall 30b and the right side wall 30c (not shown in FIG. 22A) of the cradle 30 as the guide of the left side face and the right side face of the printer 1. This can position the printer 1 in the transverse direction. Then as shown in FIG. 22A, the user may bring the rear end of the printer 1 into contact with the rear end wall 30d of the cradle 30 so as to insert the protrusions 311 of the cradle 30 into the grooves 121 of the printer 1. Such protrusions 311 of the cradle 30 inserted into the grooves 121 of the printer 1 limits the movement of the printer 1 relative to the cradle 30 in the left-right direction.

That is, the printer 1 and the cradle 30 are in contact and are not joined, and the movement of the printer 1 relative to the cradle 30 in the left-right direction (one example of a second direction) is limited.

As shown in FIGS. 23A and 24A, the joint 305 includes a base 305a, a claw 305b, an engagement part 305c, and an engagement pin 305d, and these parts are integrally formed. Between the base 305a of the joint 305 and a supporting part 316 fixed to the lower face inside of the cradle 30, a coil spring 318 is disposed. The engagement pin 305d of the joint 305 is inserted into a guide hole 317 as a hole that is fixed to the lower face of the cradle 30 and is a long hole in the front-rear direction. This means that the joint 305 can move in the front-rear direction. When no external force acts, the joint 305 is located in the rearmost position due to the biasing force from the coil spring 318.

As shown in FIG. 22A, after engaging the printer 1 at the rear end with the cradle 30, the user moves the printer 1 downward (one example of a first direction) from the bottom face of the printer 1 toward the upper face of the cradle 30 to mount a front part of the printer 1 on the cradle 30. Then, the protrusions 105a of the joints 105 of the printer 1 firstly come in contact with the claws 305b of the joint 305 of the cradle 30.

As shown in FIG. 24A, since the claw 305b has an inclined face 305ba, pressing of the inclined face 305ba of the claw 305b by the protrusion 105a of the joint 105 moves the joint 305 forward against the biasing force of the coil spring 318. Then the protrusion 105a of the joint 105 can move below the claw 305b. After the protrusion 105a of the joint 105 moves below the claw 305b, the joint 305 returns to the original position (the position shown in FIG. 24A) due to the biasing force of the coil spring 318. As a result, as shown in FIG. 24A, the joint 105 and the joint 305 are joined. That is, the printer 1 and the cradle 30 are joined. After joining the printer 1 and cradle 30, the protrusions 311 of the cradle 30 are completely inserted into the groove 121 of the printer 1 as shown in FIG. 22B.

When the joint 105 and the joint 305 are joined, the protrusion 105a of the joint 105 of the printer 1 and the engagement face 305bb of the joint 305 of the cradle 30 engage in the vertical direction (i.e., the direction orthogonal to the referential face 10Bs of the bottom face of the printer 1).

As shown in FIG. 16, the cradle 30 has the elastic members 319 (two positions) protruding from the referential face 30Fs of the upper face. These elastic members 319 enhance the engagement force between the protrusion 105a and the engagement face 305bb by applying an elastic force on the bottom face of the printer 1 in the direction away from the bottom face of the cradle 30. That is, in FIG. 24A, the elastic members 319 apply a force to push the protrusion 105a of the joint 105 of the printer 1 upward, and therefore an upward force acts on the engagement face 305bb of the claw 305b via the protrusion 105a. As a result, this can enhance the engagement force between the protrusion 105a and the engagement face 305bb.

(5-2) Removing Printer 1 without Battery Unit 20 from Cradle 30

Next, the following describes the operation to remove the printer 1 mounted on the cradle 30 (i.e., the printer 1 joined with the cradle 30).

To remove the printer 1 from the cradle 30, the user may pull the cancel lever 315 at the front end of the cradle 30 forward. Such an operation to pull the cancel lever 315 forward cancels the joining of the joint 305 of the cradle 30 and the joint 105 of the printer 1. Referring to FIGS. 23 and 24, the following describes the canceling of the joining of the joint 305 and the joint 105.

As shown in FIG. 23A, the cancel lever 315 includes a pair of shafts 315a, and the cancel lever is pivotally supported at the bottom of the cradle 30 via the shafts 315a. That is, when the user moves the cancel lever 315, the cancel lever 315 as a whole rotates about the shafts 315a.

The cancel lever 315 has a bag shape having an opening directed to the base 305a of the joint 305, and holds the engagement part 305c of the joint 305.

As the user moves the cancel lever 315 in FIGS. 23A and 24A to lay down to the front, the cancel lever 315 rotates about the shafts 315a while pulling the engagement part 305c of the joint 305 forward. As the engagement part 305c moves forward, the claws 305b move forward against the biasing force of the coil spring 318. As a result, as shown in FIG. 24B, engagement of the protrusion 105a of the joint 105 and the claw 305b is cancelled, so that the front part of the printer 1 can move upward. That is, the user may lay down the cancel lever 315 to the front while lifting up the front part of the printer 1 so as to cancel the joining of the printer 1 and the cradle 30.

When the joining of the printer 1 at the front part is canceled, the printer 1 is ready for the operation to change the rear part from the state of FIG. 22B to the state of FIG. 22A. The operation can cancel the engagement of the groove 121 and the protrusions 311.

(5-3) Mounting Printer 1 with Battery Unit 20 Attached on Cradle 30

Next the following describes the operation to mount the printer 1 with the battery unit 20 attached on the cradle 30.

In this case, the bottom face of the battery unit 20 is mounted on the upper face of the cradle 30. At this time, the protrusions 303 (FIG. 16) on the upper face of the cradle 30 are removably inserted into the grooves 223 (see FIG. 12) on the bottom face of the battery unit 20. The battery unit 20 has the recess 225 at the front end of the bottom face, and the joint 305 of the cradle 30 is inserted into this recess 225. The join 305 is free in this recess 225, and so the battery unit 20 and the cradle 30 are not joined.

(5-4) Removing Printer 1 with Battery Unit 20 Attached from Cradle 30

Next the following describes the operation to remove the printer 1 with the battery unit 20 attached from the cradle 30.

As stated above, when the bottom face of the battery unit 20 is mounted on the upper face of the cradle 30, the joint 305 is free in the recess 225 and the protrusions 303 are just removably inserted into the grooves 223 of the battery unit 20. Therefore, the user can remove the printer 1 from the cradle 30 easily by lifting up the printer 1 with battery unit 20 attached.

As stated above, the mounting system 50 of the present embodiment includes the cradle 30 to mount the battery unit 20 or the printer 1 and the joint mechanism 300. When the printer 1 does not have the battery unit 20 attached, the joint mechanism 300 joins the printer 1 and the cradle 30. When the printer 1 has the battery unit 20 attached, the joint mechanism does not join the printer 1 and the cradle 30. The mounting system 50 of the present embodiment therefore can control the joint state of the printer 1 with the cradle 30.

The present embodiment includes a joint mechanism to join an electronic device (e.g., the printer 1) and a mounting device (e.g., the cradle 30) when a battery container (e.g., the battery unit 20) is not attached to the electronic device. The joint mechanism does not join the electronic device and the mounting device when the battery container is attached to the electronic device. This means that the mounting system includes a joint mechanism to join an electronic device and a mounting device, and when a battery container is attached to the electronic device, the joint mechanism does not join the electronic device and the mounting device, and when the battery container is not attached to the electronic device, the joint mechanism joins the electronic device and the mounting device.

More specifically, when the battery unit 20 is attached to the printer 1, the printer 1 and the cradle 30 are not joined. Therefore, when the printer 1 is powered by a battery for use, the user can easily switch between a mode of charging with the battery and a mode to use the printer 1. That is, when charging with the battery, the printer with the battery unit attached may be mounted on the cradle 30. When the printer 1 is used, the user may simply lift up the printer 1 with the handle 19.

When the printer 1 does not have the battery unit 20 attached, the joint mechanism joins the printer 1 and the cradle 30. Therefore the user can use the printer while carrying the printer 1 and the cradle 30 integrally. Advantageously, the cradle 30 includes the AC adaptor 400 built therein, and so the AC adaptor 400 can be protected during the use of the printer. Additionally, the printer 1 is light in weight because it does not have the battery unit 20 attached, and so this mode has an advantage of easy carrying of the printer 1 and the cradle 30.

(6) MODIFIED EXAMPLES

The following describes modified examples of the mounting system 50 of the present embodiment.

(6-1) First Modified Example

Figure 25:
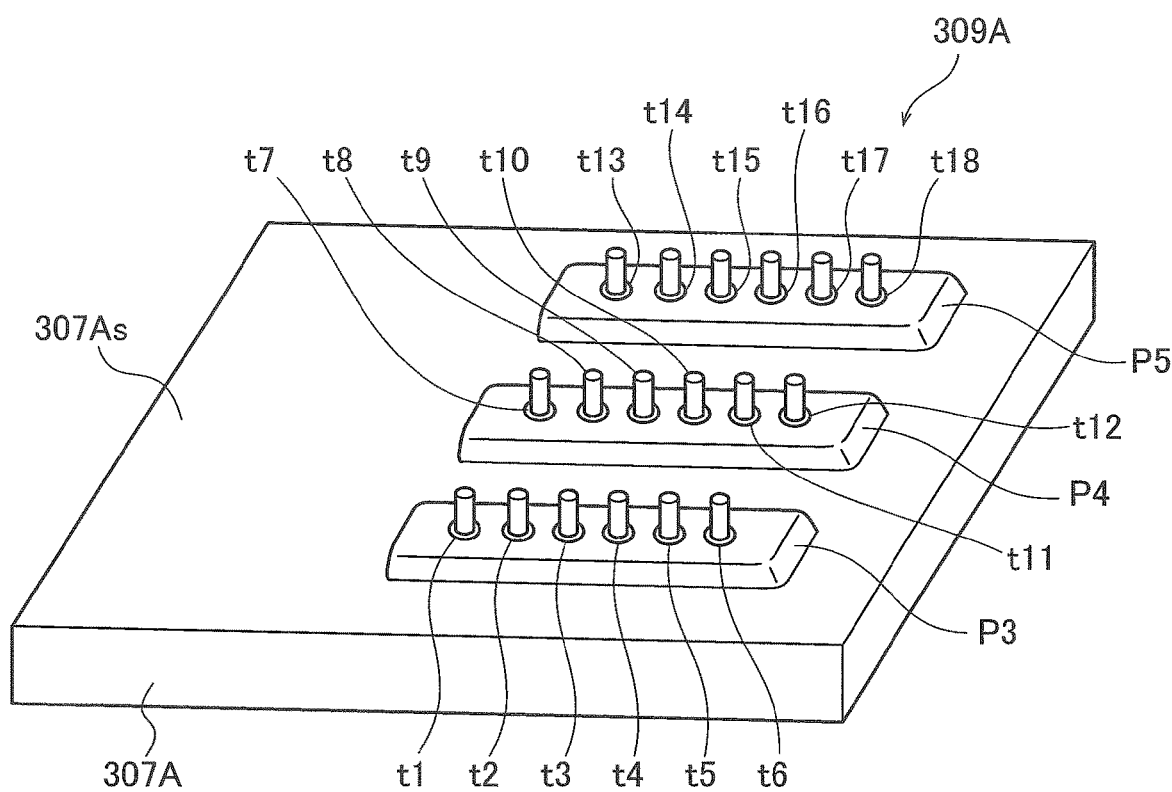
FIG. 25 shows a modified example of a connector in a cradle according to one embodiment.

A first modified example relates to a modified example of the connector 309 of the cradle 30. Referring to FIG. 25, the following describes a connector 309A according to this modified example. FIG. 25 shows a modified example of the connector in the cradle 30 according to the present embodiment.

The connector 309A according to this modified example is similar to the connector 309 in that the referential face 307A of the PCB housing 307A has bumps, but differs from the connector 309 in that the bumps do not have protrusions.

The connector 309A of this modified example has a feature in the arrangement of terminals. Specifically, the terminals include a first terminal group of the terminals to which a same first voltage is applied and a second terminal group of the terminals to which a same second voltage is applied. Then the first terminal group and the second terminal group are disposed at mutually different bumps of the plurality of bumps P3 to P5. One example of the first voltage is a power-supply voltage, and one example of the second voltage is GND voltage. For instance, all of terminals t1 to t6 at bump P3 are GND terminals, and all of terminals t7 to t12 at bump P4 are terminals, to which the power-supply voltage is applied (i.e., power-supply terminals). All of terminals t13 to t18 at bump P5 are terminals, to which a predetermined signal is applied.

The connector 309A of this modified example does not have a protrusion between the adjacent terminals at each bump. Instead, terminals for the same voltage or for a same type of voltage concentrate at one bump. Therefore, liquid existing on the surface of bumps P3 to P5, if any, hardly causes a serious problem about the short-circuit between these terminals. For instance, short-circuit of power-supply terminals and GND terminals hardly occurs. Therefore, unlike the connector 309, the connector 309A is reliable without protrusions at bumps.

(6-2) Second Modified Example

In the above embodiment, to mount the printer 1 on the cradle 30 and join them, the printer 1 and the cradle 30 engage through the engagement mechanisms 310 located rearward. Thereafter, the printer 1 and the cradle 30 join through the joint mechanism 300. The engagement mechanism 310 is not essential. For instance, in another example, when the cradle 30 may have the joint mechanism 300 at a center position in the front-rear direction, the printer 1 joining with the cradle 30 does not separate from the cradle 30 greatly at the front end and the rear end. Therefore, the user can carry the printer 1 and the cradle 30 integrally without problems, although they do not engage through the engagement mechanism 310. A person skilled in the art could dispose a joint mechanism at the center position of the cradle 30 in the front-rear direction by changing the design of the joint 305 and without a need of changing the position of the cancel lever 315. For instance, a distance between the base 305a and the engagement part 305c may be adjusted.

(6-3) Third Modified Example

The above embodiment describes the example where the outer edge of the bottom face of the printer 1 and the outer edge of the bottom face of the battery unit 20 coincide with each other. In another example, the upper face of the battery unit 20 may cover the entire bottom face of the printer 1 in the plan view. Specifically, the mounting system may include a printer body and a battery container (e.g., the battery unit 20) that can be attached to the body detachably. When the battery container is attached to the printer body, the upper face of the battery container may cover the entire bottom face of the printer body in the plan view. For instance, the outer edge of the bottom face of the battery unit 20 to be attached to the bottom face of the printer 1 may be larger than the outer edge of the bottom face of the printer 1. In that case, since the outer edge of the bottom face of the battery unit 20 is larger than that of the printer 1, the printer 1 having the battery unit 20 attached can keep the posture more stably. Similarly to the above embodiment, this can make the printer 1 without the battery unit 20 compact because the printer 1 does not internally have a battery housing to store a battery.

That is detailed descriptions on the embodiment of the present invention. The mounting system of the present invention is not limited to the above embodiments, and the embodiments may be modified or changed variously without departing from the scope of the present invention.

The above example describes the continuous sheet P including a belt-like liner PM and a plurality of labels PL that are temporally attached on the liner at predetermined intervals as an example of the roll of paper R to be stored in the printer 1. In another embodiment, any type of the roll of paper R may be used, which may be wound print paper not including an adhesive or wound print paper that is long and includes adhesive on the rear face.

The above embodiment describes a printer as one example of the electronic device. The above embodiment may be applied to other electronic devices as well, such as a personal computer, a mobile phone, a digital video camera, and a digital still camera.

REFERENCE SIGNS LIST 50 mounting system
1 printer
2 housing
3 cover
31 shaft
4 display panel
5 platen roller
6 thermal head
7 ejection port
8 container
9 damper
10 guide mechanism
11 motor
13, 17 assisting roller
18 controller
19 handle
10Bs referential face
101 leg
103,121 groove
105 joint
107, 113 recess
109 connector cover
111 recess
115 connector
20 battery unit
20Fs, 20Bs referential face
201 leg-receiving part
203, 211 protrusion
207 PCB housing
213 battery housing
213H hollow
215 connector
221 leg
223 groove
225, 227 recess
226 connector
229 connector cover
231 battery cover
233 lever
235 cancelling part
30 cradle
30a front end wall
30b left side wall
30c right side wall
30d rear end wall
30Fs, 30Bs referential face
300 joint mechanism
301 leg-receiving part
303 protrusion
311 protrusion
305 joint
305a base
305b claw
305c engagement part
305d engagement pin
307, 307A PCB housing
307s, 307As referential face
309, 309A connector
310 engagement mechanism
315 cancel lever
315a shaft
316 supporting part
317 guide hole
318 coil spring
319 elastic member
321 leg
323 cover
325 claw
327 adaptor housing
327h opening
329 cable housing
331 connector
400 AC adaptor
C1, C2 cable
T1 to T20, t1 to t18 terminal
P1 to P5 bump
W1 to W3 protrusion
SP1, SP2 terminal container
B1 print circuit board R roll of paper
P continuous sheet
PM liner
PL label

The invention claimed is:

1. A mounting system, comprising:
a battery container having a charging terminal and configured to store a secondary battery;
an electronic device having a power-supply terminal and configured to attach the battery container thereto detachably;
a mounting device having an external power-supply terminal to supply external power and configured to mount the battery container or the electronic device thereon; and
a joint mechanism configured to lock the electronic device and the mounting device when the battery container is not attached to the electronic device,
wherein the joint mechanism does not lock the electronic device and the mounting device when the battery container is attached to the electronic device and is mounted on the mounting device.

2. The mounting system according to claim 1, wherein
when the electronic device is mounted on the mounting device, the power-supply terminal of the electronic device comes in contact with the external power-supply terminal of the mounting device, and
when the battery container is mounted on the mounting device, the charging terminal of the battery container comes in contact with the external power-supply terminal of the mounting device.

3. The mounting system according to claim 1, wherein
when the battery container is mounted on the mounting device, a bottom face of the battery container faces an upper face of the mounting device, and
when the battery container is attached to the electronic device, a bottom face of the electronic device faces an upper face of the battery container.

4. The mounting system according to claim 1, wherein
the joint mechanism joins the electronic device and the mounting device in response to a movement of the electronic device in a first direction from a bottom face of the electronic device to an upper face of the mounting device, and
the mounting system further comprises an engagement mechanism, the engagement mechanism configured to engage the electronic device and the mounting device so as to limit a movement of the electronic device relative to the mounting device in a second direction different from the first direction when the electronic device and the mounting device are in contact and are not joined.

5. The mounting system according to claim 1, wherein
the joint mechanism engages a part of the electronic device and a part of the mounting device in a direction orthogonal to a bottom face of the electronic device when the electronic device and the mounting device join, and
the mounting device includes an elastic member on an upper face, the elastic member being configured to apply an elastic force to the bottom face of the electronic device in a direction away from a bottom face of the mounting device to enhance the engagement of the part of the electronic device and the part of the mounting device.

6. The mounting system according to claim 1, wherein
the battery container includes a power-supply terminal connected to the secondary battery,
the electronic device has a second power-supply terminal, and
when the battery container is attached to the electronic device, the second power-supply terminal of the electronic device comes in contact with the power-supply terminal of the battery container.

7. The mounting system according to claim 1, wherein the electronic device is a printer.

8. The mounting system according to claim 1, wherein the mounting device includes:
a first terminal group that electrically connects with a device to be mounted that is the electronic device or the battery container, the first terminal group including terminals to which a same first voltage is applied;
a second terminal group that is different from the first terminal group and electrically connects with the device to be mounted, the second terminal group including terminals to which a same second voltage is applied; and
a plurality of bumps that stand from a referential face, the referential face being opposed to the device to be mounted when the device to be mounted is mounted on the mounting device, wherein
the first terminal group and the second terminal group are disposed at a different bump of the plurality of bumps from each other.

9. The mounting system according to claim 1, wherein the mounting device includes:
a plurality of terminals including terminals that electrically connect to a device to be mounted that is the electronic device or the battery container;
a bump standing from a referential face, the referential face being opposed to the device to be mounted when the device to be mounted is mounted on the mounting device, the plurality of terminals being arranged to be exposed on the bump, and
a protrusion disposed between two terminals among the plurality of terminals, the protrusion protruding from a surface of the bump, a different voltage being applied to the two terminals.

10. The mounting system according to claim 9, wherein terminals to which a same voltage is applied, among the plurality of terminals, are adjacent to each other.

11. The mounting system according to claim 9, wherein the protrusion comprises a wall standing from the surface of the bump, the wall having faces opposed to the two terminals.

12. The mounting system according to claim 1, wherein an outer edge of a bottom face of the battery container and an outer edge of a bottom face of the electronic device coincide with each other.

13. The mounting system according to claim 1, wherein the battery container includes a housing close to the center in the plan view, the housing being configured to store the secondary battery.

14. The mounting system according to claim 1, wherein
the electronic device has a groove for engagement at a bottom part thereof,
the battery container has a protrusion for engagement at an upper face thereof, and
engagement of the groove and the protrusion attaches the battery container to the electronic device.

15. The mounting system according to claim 1, wherein the electronic device includes a display panel, the display panel is inclined relative to a mounting face of the mounting device with a first inclination angle when the electronic device without the battery container attached is mounted on the mounting face, the display panel is inclined relative to a mounting face of the mounting device with a second inclination angle when the electronic device with the battery container attached is mounted on the mounting face, and the first inclination angle and the second inclination angle are the same.

16. The mounting system according to claim 1, wherein the electronic device and the battery container are configured such that when the battery container is attached to the electronic device, the electronic device is electrically connected to the mounting device.

17. The mounting system according to claim 1, wherein the electronic device, the battery container, and the mounting device are configured to be arranged in this order.

18. A mounting system, comprising:
a battery container having a charging terminal and configured to store a secondary battery;
an electronic device having a power-supply terminal and configured to attach the battery container thereto detachably;
a mounting device having an external power-supply terminal to supply external power and configured to mount the battery container which is attached to the electronic device or the electronic device thereon; and
a joint mechanism configured to lock the electronic device and the mounting device when the battery container is not attached to the electronic device,
wherein the joint mechanism does not lock the electronic device and the mounting device when the battery container is attached to the electronic device.

19. The mounting system according to claim 18, wherein the electronic device and the battery container are configured such that when the battery container is attached to the electronic device, the electronic device is electrically connected to the mounting device.

20. The mounting system according to claim 18, wherein the electronic device, the battery container, and the mounting device are configured to be arranged in this order.

21. A mounting system, comprising:
a battery container configured to store a secondary battery;
an electronic device configured to attach the battery container thereto detachably;
a mounting device configured to mount the battery container or the electronic device thereon; and
wherein the electronic device and the mounting device are configured to lock the electronic device and the mounting device when the battery container is not attached to the electronic device,
wherein the battery container and the mounting device are configured to not lock the electronic device and the mounting device when the battery container is attached to the electronic device and is mounted on the mounting device.

22. The mounting system according to claim 21, wherein the battery container and the electronic device are configured to lock to each other.

23. The mounting system according to claim 21, wherein the mounting device has an external power-supply terminal to supply external power, and
the electronic device and the battery container are configured such that when the battery container is attached to the electronic device and is mounted on the mounting device, the electronic device is electrically connected to the mounting device.

24. The mounting system according to claim 21, wherein the electronic device, the battery container, and the mounting device are configured to be arranged in this order.

25. The mounting system according to claim 21, wherein the mounting device has an external power-supply terminal to supply external power, and
the electronic device and the battery container are configured such that when the battery container is attached to the electronic device and is mounted on the mounting device, the battery container is electrically connected to the mounting device.

26. The mounting system according to claim 21, wherein the mounting device has an external power-supply terminal to supply external power, and
the electronic device is configured such that when the battery container is not attached to the electronic device and the electronic device is mounted on the mounting device, the electronic device is electrically connected to the mounting device.

* * * * *